US012587159B1

(12) United States Patent
Duan et al.

(10) Patent No.: US 12,587,159 B1
(45) Date of Patent: Mar. 24, 2026

(54) NONLINEAR TRANSMISSION LINE (NLTL) WITH CONTROLLABLE HARMONIC OUTPUT POWER SPECTRUM

(71) Applicant: Northrop Grumman Systems Corporation, Falls Church, VA (US)

(72) Inventors: Dah-Weih Duan, Redondo Beach, CA (US); Mansoor K. Siddiqui, Redondo Beach, CA (US); Stephane Larouche, Redondo Beach, CA (US); Kenneth F. Sato, Redondo Beach, CA (US); Kwok K. Loi, Redondo Beach, CA (US); Minhdao D. Truong, Redondo Beach, CA (US); Wesley W. Chan, Redondo Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 141 days.

(21) Appl. No.: 18/383,917

(22) Filed: Oct. 26, 2023

(51) Int. Cl.
*H03H 7/25* (2006.01)
*H03H 7/01* (2006.01)

(52) U.S. Cl.
CPC .......... *H03H 7/256* (2013.01); *H03H 7/0115* (2013.01); *H03H 7/1758* (2013.01)

(58) Field of Classification Search
CPC .... H03F 2200/451; H03F 3/19; H03F 1/0205; H03F 1/565; H03F 2200/378; H03F 2200/546; H03F 3/193; H03F 3/21; H01P 1/2039; H01P 1/15; H03B 5/1243; H03B 5/1847; H03B 1/00; H03B 2201/0208; H03B 19/05; H03B 2200/004; H03H 7/1758; H03H 9/542; H03H 11/24; H03H 2007/013; H03H 7/0115; H03H 7/0123; H03H 7/256
See application file for complete search history.

(56) References Cited

U.S. PATENT DOCUMENTS

| | | | | | |
|---|---|---|---|---|---|
| 6,239,637 | B1 * | 5/2001 | Williamson | ............. | H03K 5/12 |
| | | | | | 327/134 |
| 6,900,710 | B2 * | 5/2005 | Agoston | ............ | G01R 19/2509 |
| | | | | | 333/248 |
| 8,466,845 | B2 | 6/2013 | Elsallal et al. | | |
| 2008/0246551 | A1 * | 10/2008 | Noujeim | ................. | H03K 5/12 |
| | | | | | 327/170 |
| 2009/0115545 | A1 * | 5/2009 | Lan | ...................... | H04B 1/7174 |
| | | | | | 332/109 |
| 2010/0007426 | A1 * | 1/2010 | Ricketts | ................. | H03L 7/099 |
| | | | | | 331/107 T |

(Continued)

OTHER PUBLICATIONS

"Non-Linear Transmission Line Comb Generators Part-2: Solutions to the Low Phase Noise Problem", Jul. 1, 2022, 4 pages.

(Continued)

*Primary Examiner* — Lincoln D Donovan
*Assistant Examiner* — Tyler J Pereny
(74) *Attorney, Agent, or Firm* — Dority & Manning, P.A.

(57) ABSTRACT

A nonlinear transmission line (NLTL) comprises a plurality of interconnected transmission line cells, each including a shunt path and a transmission line length wherein the shunt path includes a varactor diode and an inductor coupled in series with the varactor diode. A shunt path transmission line may be coupled in the shunt path and one or more filters may be coupled to an input and/or an output of the NLTL.

26 Claims, 28 Drawing Sheets

(56)        References Cited

U.S. PATENT DOCUMENTS

2013/0141270 A1*   6/2013   Rodenbeck ......... G01S 13/0209
                                                                342/21
2021/0091759 A1*   3/2021   Prager ..................... H03K 5/12

OTHER PUBLICATIONS

Breitbarth et al., "Spectral Performance and Noise Theory of Nonlinear Transmission Line Frequency Multipliers", 2017 IEEE, pp. 261-264.
Fairbanks et al., "A Review of Nonlinear Transmission Line System Design", IEEE Journals & Magazine IEEE Xplore, vol. 8, 17 pages.
Liou, "On-Chip Spiral Inductors for RF Applications: an Overview", Journal of Semiconductor Technology and Science, Sep. 2004, 20 pages.
Rodwell et al., "GaAs Nonlinear Transmission Lines for Picosecond Pulse Generation and Millimeter-Wave Sampling", IEEE Transactions on microwave theory and techniques, vol. 39, No. 7 , Jul. 1991.
Sawdai et al., "GaAs Schottky Varactor Diode Optimization for High-Performance Nonlinear Transmission Lines", TRW Inc, Space & Electronics Group, 1991, pp. 87-88.

* cited by examiner

FREQ_OUT_S freq_out_s

Vd (volts)

time, nsec

FIG. 17 freq_out_s freq_out_s freq_out_s

FIG. 25 freq_out_s

NONLINEAR TRANSMISSION LINE (NLTL) WITH CONTROLLABLE HARMONIC OUTPUT POWER SPECTRUM

FIELD OF DISCLOSURE

The present subject matter relates to radio frequency (RF) circuits, and more particularly to a nonlinear transmission line (NLTL).

BACKGROUND

RF circuits often use frequency multipliers in the form of a comb generator to develop multiple RF frequencies for particular uses, such as to develop stable reference signal correlated to a base frequency signal. A comb generator is realized by a NLTL having a set of N unit cells each comprising a shunt branch and a transmission line length. Each shunt branch includes a nonlinear device in the form of a varactor diode. When driven by an RF waveform (or tone) at a fundamental frequency, a comb filter develops a frequency spectrum that includes a strong leak-through of the fundamental frequency and decreasing power with increasing harmonic index N according to, for example, $-20*\log_{10}$ (N). The fundamental frequency and some lower harmonics are undesired and must be eliminated. Proper elimination of these components often requires wide-band diplexers that may be considerably more difficult to design than filters. On the other hand, higher harmonics at, for example, the $10^{th}$ to $20^{th}$ harmonics, are often desirable. While the output power spectrum can be improved by controlling transmission line parameters and attending to component design, one cannot eliminate the problem of decreasing output power with increasing harmonic index. The low power magnitudes of the desired harmonics result in the need for stringent filtering and amplification to render such frequencies useful for subsequent RF signal processing.

SUMMARY

According to one aspect, a nonlinear transmission line (NLTL) comprises a plurality of transmission line cells interconnected between an input and an output. Each transmission line cell includes a shunt path coupled to a main transmission line portion wherein the shunt path includes a shunt transmission line portion, a varactor diode, and an inductor coupled in series with the varactor diode. The NLTL further comprises at least one of a low-pass filter coupled to the input and a high-pass filter coupled to the output.

According to another aspect, a nonlinear transmission line (NLTL) comprises a plurality of transmission line cells interconnected between an input and an output. Each transmission line cell includes a shunt path coupled to a main transmission line portion, wherein the shunt path includes a shunt transmission line portion, a varactor diode coupled in series with the shunt transmission line portion, and an inductor coupled in series with the varactor diode, and wherein at least some of the shunt transmission lines have different impedances than remaining shunt transmission line portions. The NLTL further comprises a low-pass filter coupled to the input and a high-pass filter coupled to the output.

According to yet another aspect, a nonlinear transmission line (NLTL) comprises a plurality of transmission line cells interconnected between an input and an output. Each transmission line cell includes a shunt path coupled to a main transmission line portion having an impedance wherein the shunt path includes a shunt transmission line portion having an impedance, a varactor diode, and an inductor coupled in series with the varactor diode, wherein at least some of the varactor diodes are of a different size than remaining varactor diodes, wherein at least some of the impedances of the main transmission line portions are different than the impedances of remaining main transmission line portions, wherein the impedance of at least one of the shunt transmission line portions is different than the impedances of other shunt transmission line portions, and at least one of the inductors has a different inductive value than the inductive values of other inductors. The NLTL further comprises at least one of a low-pass filter coupled to the input and a high-pass filter coupled to the output.

According to a still further aspect, a nonlinear transmission line (NLTL) comprises a plurality of transmission line cells interconnected between an input and an output, wherein each transmission line cell includes a shunt path coupled to a main transmission line portion wherein the transmission line portions have at least one of varying lengths and varying widths.

Other aspects and advantages will become apparent upon consideration of the following detailed description and the attached drawings wherein like numerals designate like structures throughout the specification.

BRIEF DESCRIPTION OF THE DRAWINGS

FIG. 9 is a plan view of a chip implementing the NLTL of FIG. 3;

FIGS. 13-15 are enlarged, fragmentary, sectional views of portions of a diode, inductor, and via of the chip of FIG. 7 with FIG. 13 being taken generally along the lines 13-13 of FIG. 9, FIG. 14 being taken generally along the lines 14-14 of FIG. 12, and FIG. 15 being generally taken along the lines 15-15 of FIG. 11, respectively;

FIGS. 16, 18, and 24 are schematic diagrams of embodiments of idealized NLTL's;

FIGS. 17, 19, and 25 are schematic diagrams of implementations of the NLTL's of FIGS. 16, 18, and 24, respectively;

DETAILED DESCRIPTION

Figure 1:
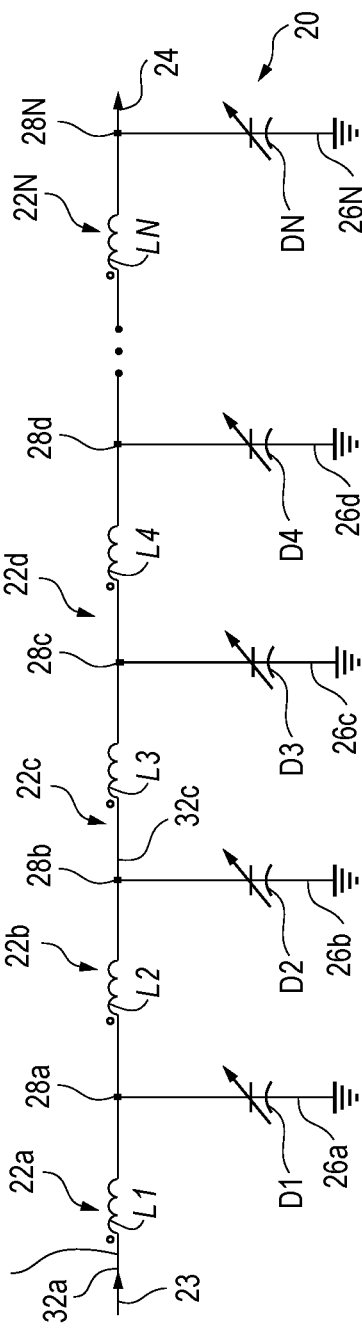
FIG. 1 is a schematic diagram of a comb generator implemented by an idealized NLTL as known in the prior art.

FIG. 1 shows a prior art comb generator implemented by a conventional nonlinear transmission line (NLTL) 20. The NLTL 20 comprises a plurality of cascaded unit cells 22a, 22b, . . . , 22N coupled between an input 23 and an output 24. In an embodiment, the unit cells 22a-22N are identical to one another, and hence only the unit cell 22a will be described in detail herein. The unit cell 22a includes a shunt path 26a coupled between a source of voltage potential, such as ground, and a junction 28a. A nonlinear element in the form of a varactor diode D1 (illustrated in FIG. 1 as a variable capacitor) is coupled in series in the shunt path 26a. A transmission line portion or length 30a is coupled between an input port 32a and the junction 28a. The portion 30a has an impedance represented by an inductor L1.

With the exception of the unit cells 22a and 22N, the unit cells 22b, 22c, . . . , 22N-1 are interconnected by coupling a junction 28 of a unit cell 22, for example, a junction 28b of the unit cell 22b, to an input port 32 of a next succeeding unit cell 22, for example, the input port 32c of the unit cell 22c. In the case of the unit cell 22a, the input port 32a is located at the input 23 of the NLTL 20 whereas in the case of the unit cell 22N, a junction 28N corresponding to the junction 28a of the unit cell 22a is disposed at the output 24 of the NLTL 20.

Figure 2:
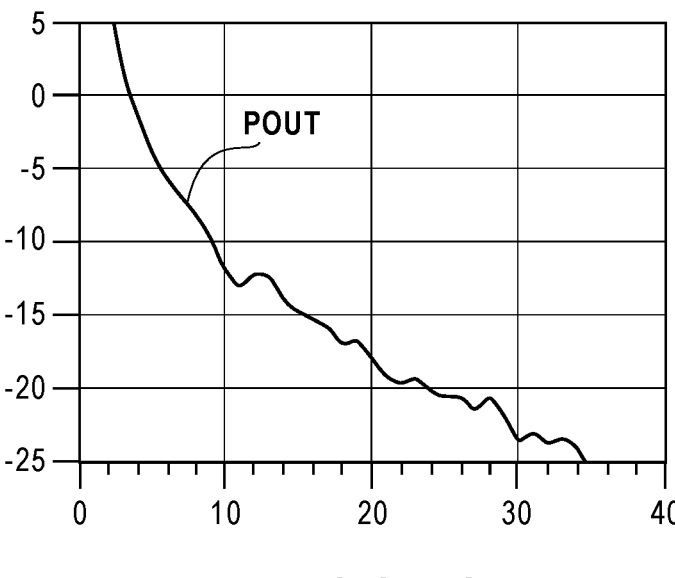
FIG. 2 is a graph of output power versus frequency of the prior art comb generator of FIG. 1.

FIG. 2 illustrates output power $P_{OUT}$ of the NLTL 20 of FIG. 1 as a function of frequency. As seen in FIG. 2, output power $P_{OUT}$ resulting from supply of a 1 GHz. input tone at 18 dBm input decreases with increasing harmonic index. Thus, for example, $P_{OUT}$ is at a significant positive or zero magnitude at the fundamental frequency up to approximately the second harmonic and drops to approximately −13 dBm at the $10^{th}$ harmonic, approximately −18 dBm at the $20^{th}$ harmonic, approximately −24 dBm at the $30^{th}$ harmonic, and so on. These characteristics result in the need to use a diplexer or other complex circuitry to eliminate the fundamental and undesirable lower-order harmonics and to filter and amplify the output power at the higher frequencies to render such frequencies suitable for use.

Figure 3:
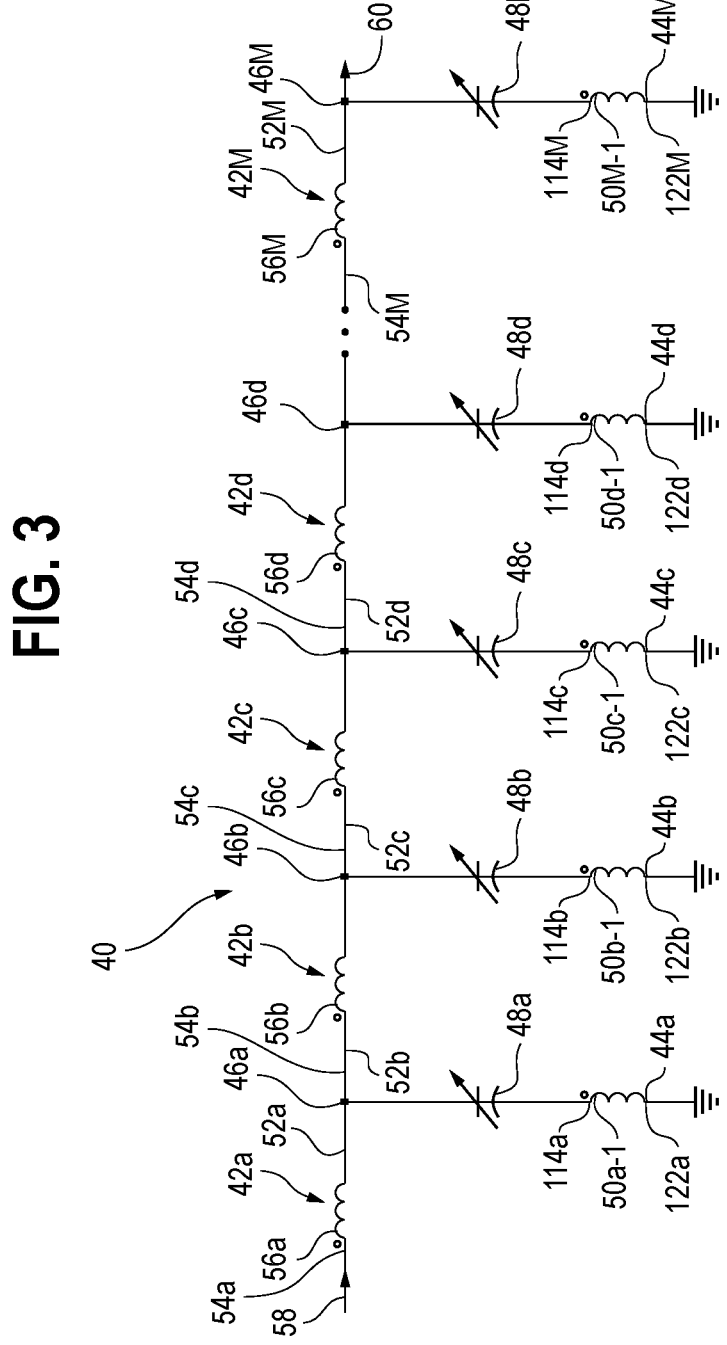
FIG. 3 is a schematic diagram of an idealized NLTL according to the present disclosure.
Figure 4:
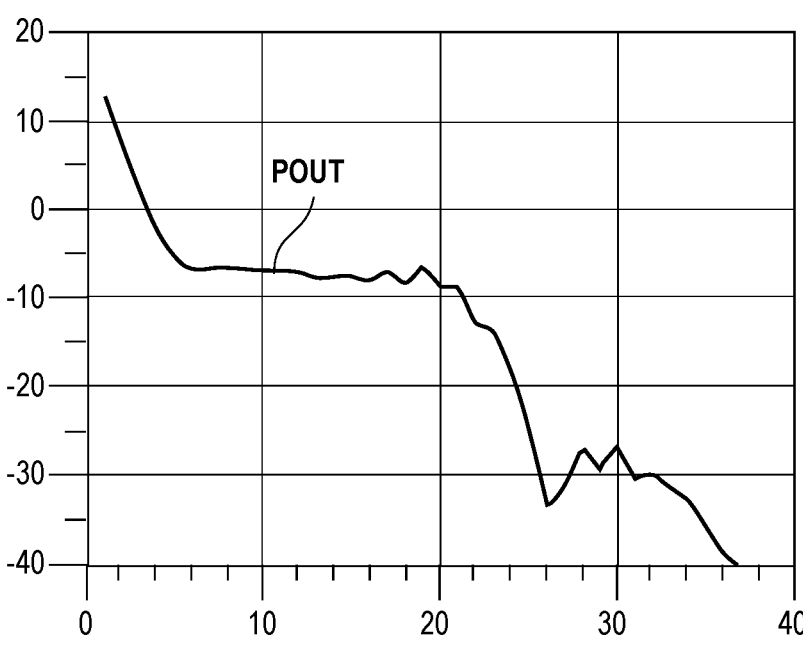
FIG. 4 is a graph of output power versus frequency of the NLTL of FIG. 3.

FIG. 3 illustrates an embodiment that exhibits a desirable flattened $P_{OUT}$ characteristic according to the graph of FIG. 4. With specific reference to FIG. 3, a comb filter implemented by an NLTL 40 comprises a plurality of M (which may be the same or different than N) cascaded transmission line cells 42a, 42b, . . . , 42M (the cells 42 are referred to as "transmission line cells" rather than "unit cells" inasmuch as, noted in greater detail hereinafter, the cells 42 are not identical to one another). Each transmission line cell 42, for example, the transmission line cell 42a, comprises a shunt path 44a coupled between a source of voltage potential, such as ground, and a junction 46a. In the illustrated embodiment, a nonlinear device comprising a varactor diode 48a is coupled in series with a first end 50a-1 of a shunt path inductor 50a in the shunt path 44a. A main transmission line portion or length 52a is coupled between an input port 54a and the junction 46a. The portion 52a has an impedance represented by an inductor 56a.

The transmission line cells 42b, 42c, . . . , 42M-1 are interconnected by coupling a junction 46 of a transmission line cell 42, for example, a junction 46b of the transmission line cell 42b, to an input port 54 of a next succeeding transmission line cell 42. Thus, for example, the input port 54c of the transmission line cell 42c is coupled to the junction 46b. In the case of the transmission line cell 42a, the input port 54a is located at an input 58 of the NLTL 40 whereas in the case of the transmission line cell 42M, a junction 46M corresponding to the junction 46a of the transmission line cell 42a is disposed at an output 60 of the NLTL 40.

In an embodiment, the transmission line cells 42a, 42b, . . . , 42M are identical in terms of inclusion and arrangement of elements; however, the inductance values, and hence, the impedances, of the inductors 50 and the design of the diodes 48; specifically, the sizes, and hence the capacitances of the diodes, may vary among transmission line cells 42. The diodes 48 and the inductance values of the inductors 50 are tuned or optimized to obtain a flattened frequency spectrum $P_{OUT}$ similar or identical to that shown in FIG. 4 in which the harmonic output power stops decreasing and instead remains at approximately the same level (plus or minus 1 dB) throughout a desired range of, for example, the $6^{th}$ through $20^{th}$ harmonics. The added shunt path inductor 50 in each shunt path 44 helps to resonate out the "static" part of the capacitance of the diode 48 and allows more signal to be used in the "variable" part of the capacitance of the diode.

In an embodiment, each varactor diode 48 may (but need not) comprise a hyper-abrupt junction diode, for example as disclosed in a paper by D. Sawdai, et al, "GaAs Schottky varactor diode optimization for high-performance nonlinear transmission lines," 60th Digest Device Research Conference, p. 87, wherein the entire contents of such paper are hereby incorporated by reference herein.

The flattened harmonic output in the desired range reduces the complexity and cost of downstream components/electronics that filter and amplify components of $P_{out}$.

Figure 5:
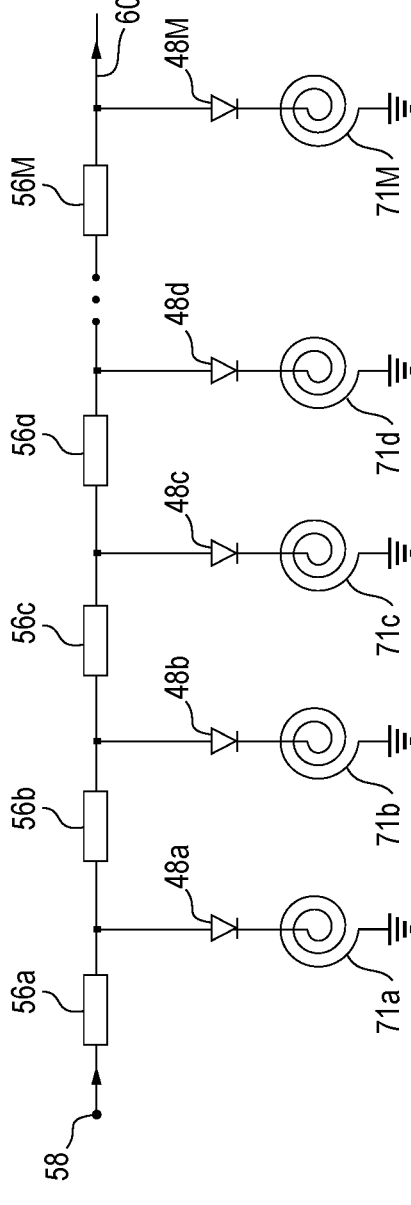
FIGS. 5 and 6 are schematic diagrams of implementations of the NLTL of FIG. 3
Figure 6:
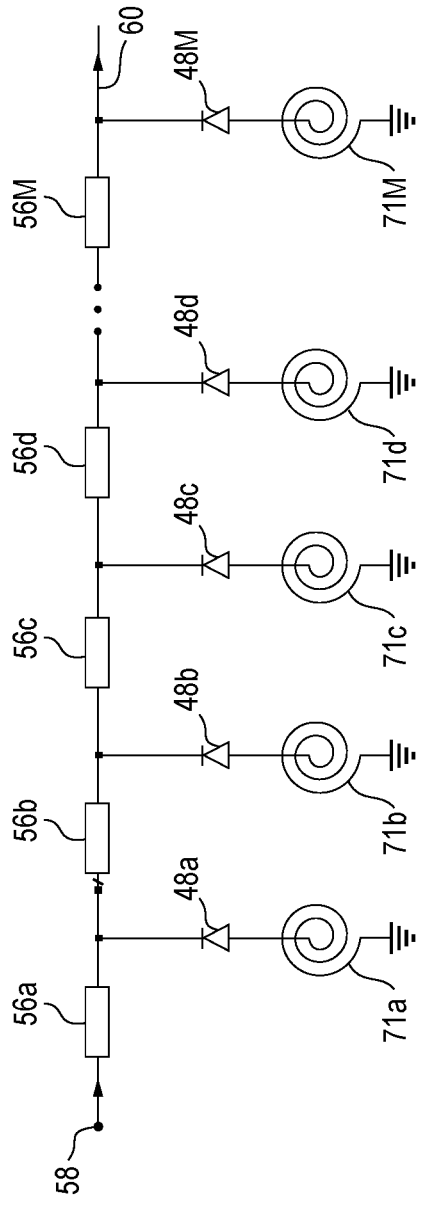

FIG. 5 illustrates an embodiment in which the inductors 50 of FIG. 3 are implemented by spiral inductors 71a, 71b, . . . , 71M. FIG. 6 illustrates an embodiment in which the diodes 48a, 48b . . . , 48M are connected in an opposite polarity compared to FIGS. 3 and 5. The embodiment of FIG. 6 may be used when the bias of the input signal is opposite the bias of the input signal supplied to the embodiment of FIG. 5. Specifically, the DC bias voltage in FIG. 5 is negative, say, −0.6 V while that in FIG. 6 is positive, say, +0.6 V so that the diodes are nominally reverse biased in both cases. In the embodiment of FIGS. 5 and 6, a DC bias may be applied to the diodes 48 via the input signal as described above, or the DC bias may be applied via the output of the NLTL. Spiral inductors may be circular, rectangular, octagonal, hexagonal, or any other No-sided figure, where No is an integer greater than zero. Also, a spiral inductor may have an integer number of windings or a fractional number of windings, as required for the inductance to be realized.

Figure 8:
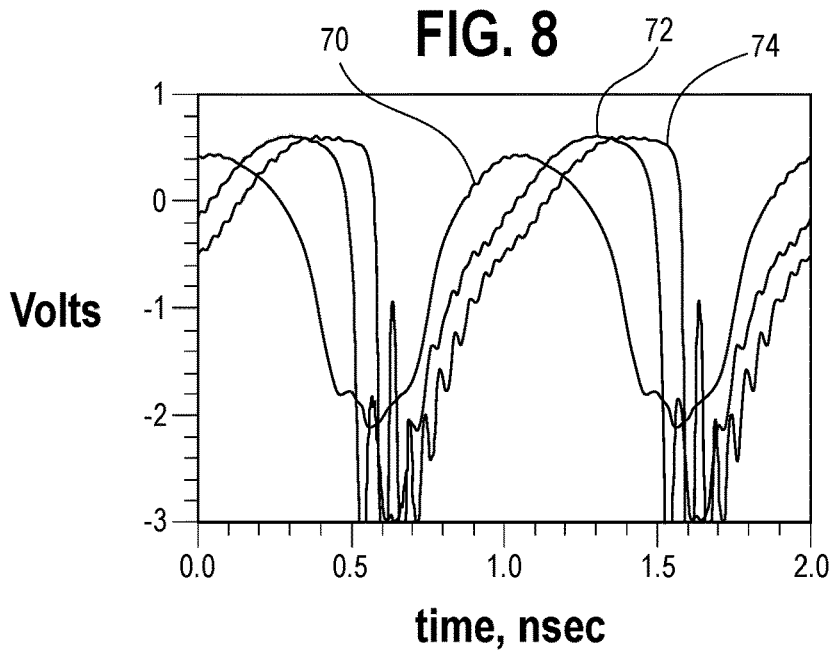
FIG. 8 is a series of waveform diagrams illustrating compression undertaken by the NLTL of FIG. 3.

The lengths and widths of the traces forming the interconnecting main transmission line portions between shunt paths impact frequency development. All of the main transmission line portions may have different lengths and/or widths or some or all of the main transmission line portions may have the same length and width. Still further, one or more of the trace widths may vary in size in one or more of the individual main transmission line portions. In an embodiment, the lengths of traces forming the interconnecting main transmission line portions are all equal to 476 micrometers and the widths of the traces forming the main transmission line portions are all constant over the line portions and equal to 15 micrometers. A design procedure to obtain an initial value of a main transmission line portion length is disclosed in a paper by J. Breitbarth and Z. Popovic, "Spectral Performance and Noise Theory of Nonlinear Transmission Line Frequency Multipliers," 2017 Joint EFTF/IFCS, p. 261, wherein the entire contents of such paper is incorporated by reference herein. In general, the main transmission line portions interact with the diode capacitances to provide an input impedance match to 50 ohms, and contribute some waveform compression for the initially sinusoidal signal travelling down the NLTL 40 so that after a plurality of shunt paths the waveform is gradually compressed to saw-tooth-like shape, which is full of harmonics, to accomplish comb generation. Such compression is shown in FIG. 8 for the case M=30 of FIG. 3, which illustrates increasing slope magnitudes and rates of change of the waveform at the first (i.e., left-most) diode 48*a*, illustrated as waveform 70, compared to the fifteenth diode at the center of the NLTL 40, illustrated by waveform 72, and the thirtieth diode 48M at the right-hand end of the NLTL 40, illustrated by waveform 74. Basically, the design procedure begins with the C-V curve (depending on diode doping profile) of a diode of a "typical" diameter, for example, 15 micrometers, and use such information to identify the impedance match, the power of the input tone, the diode bias voltage, the lengths of interconnecting lines, and the number of cells of the NLTL to obtain a design starting point assuming that all diode are of the typical diameter. Thereafter, during design refinement, diode sizes and inductor lengths are varied along the NLTL and the lengths of interconnecting lines, the number of cells, and the line widths are adjusted in order to achieve improved harmonic performance.

Figure 9:
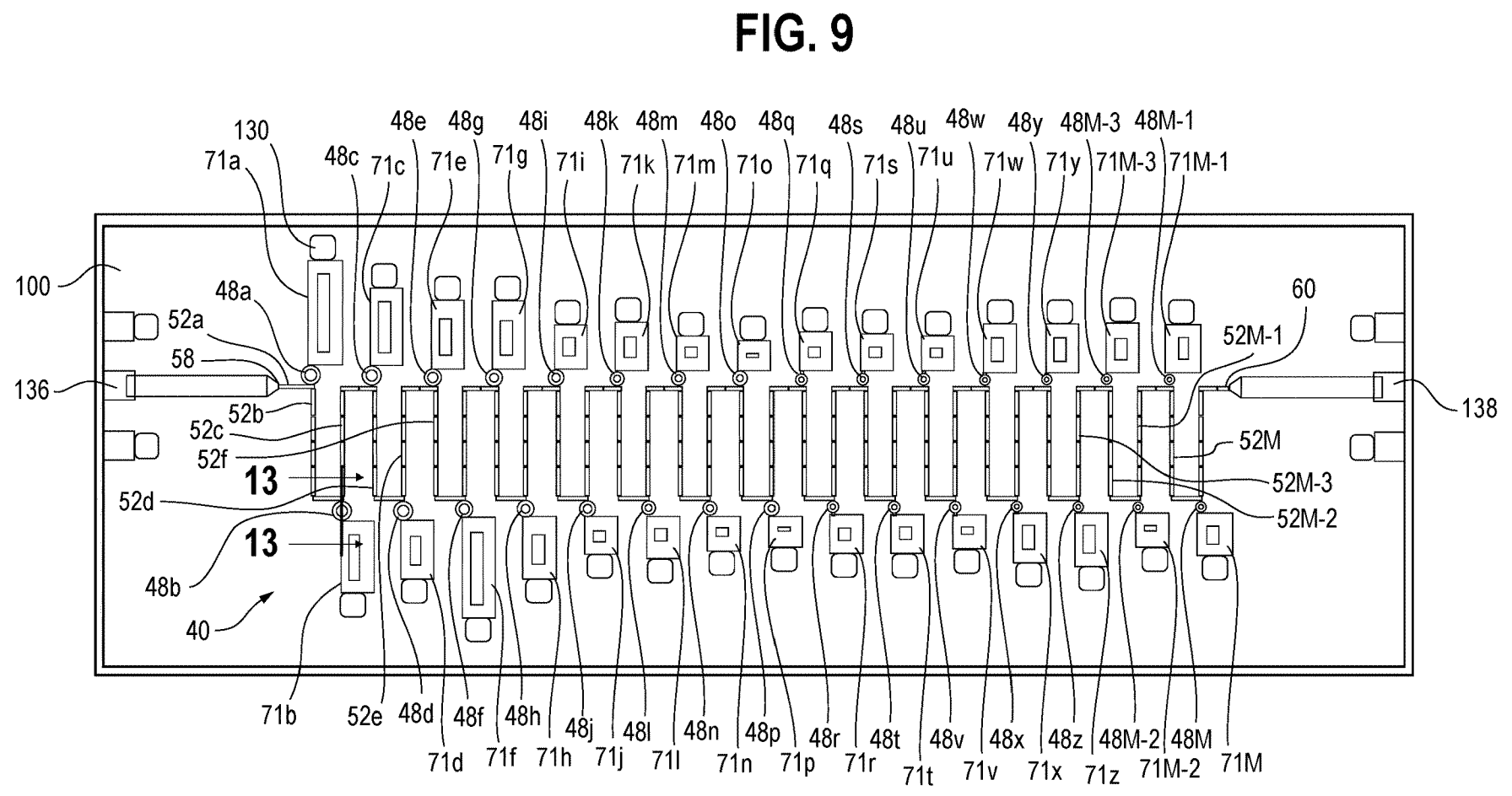
Figure 10:
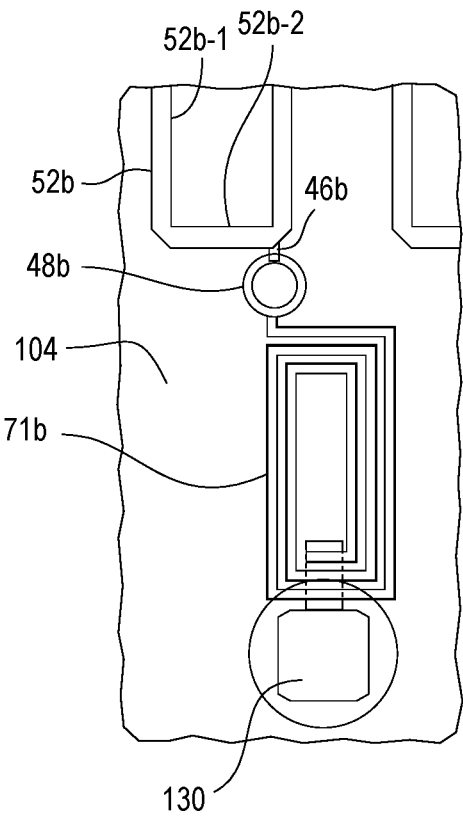
FIG. 10 is an enlarged, fragmentary, plan view of a portion of the chip of FIG. 9.
Figure 13:
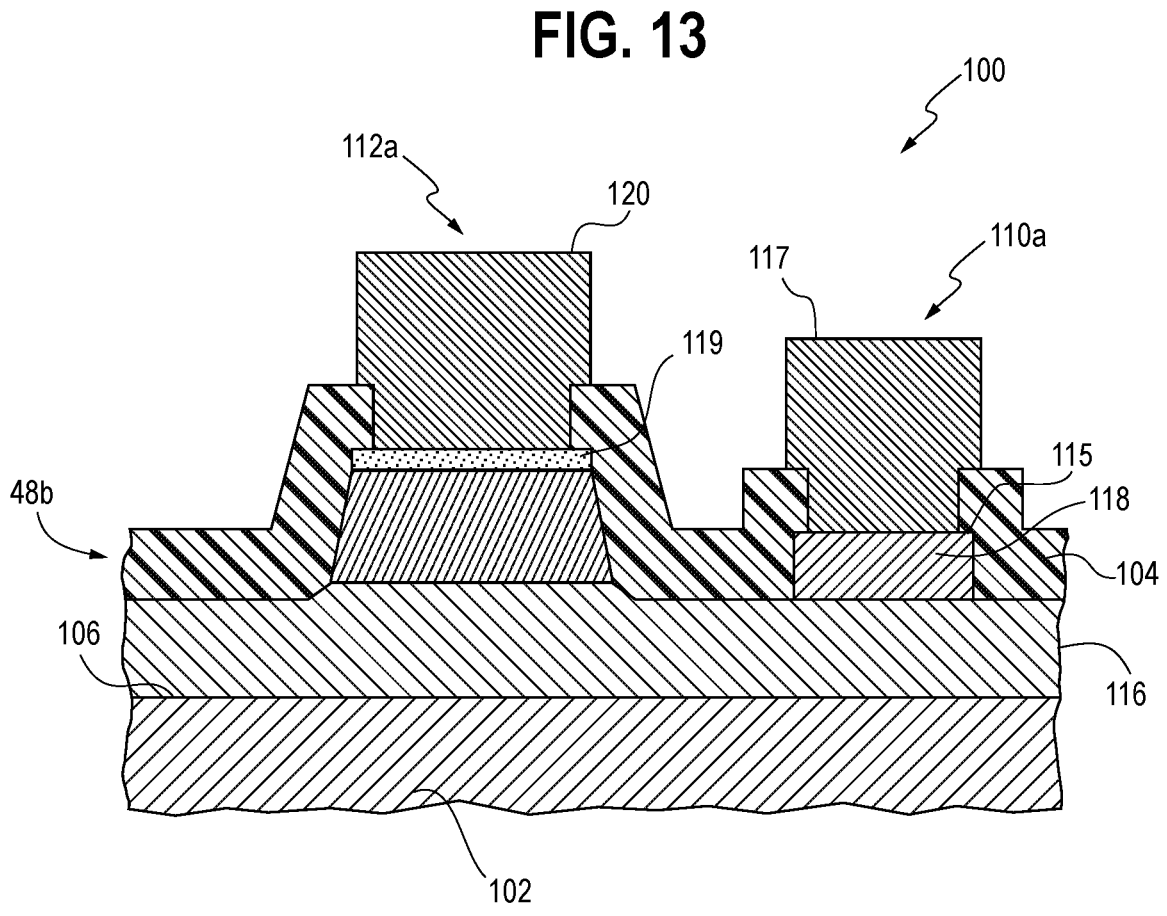
Figure 15:
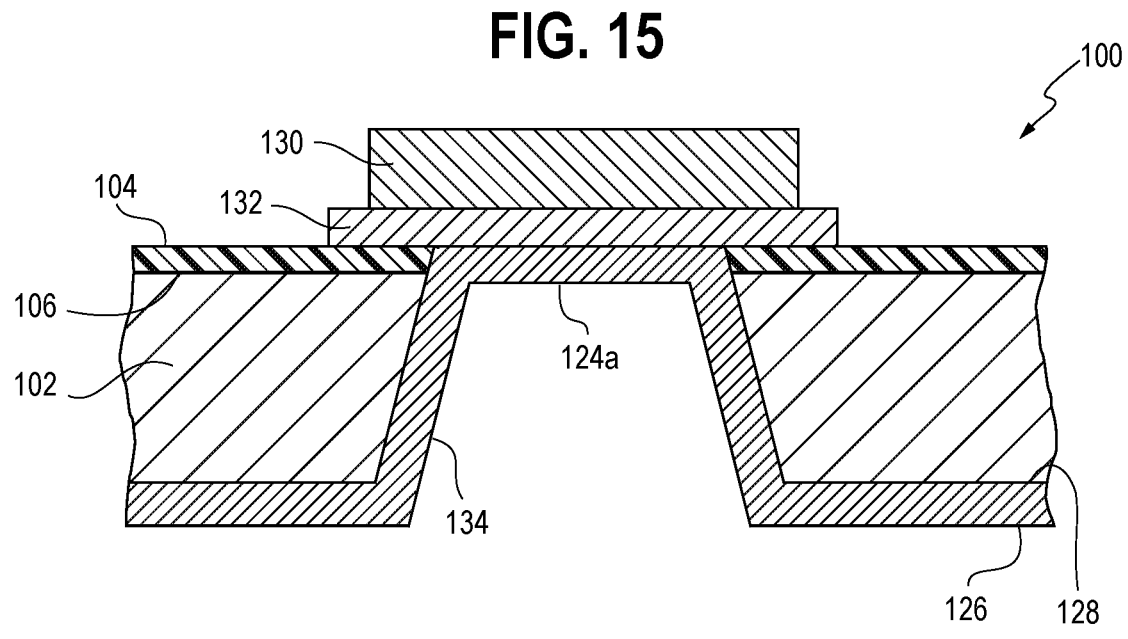
Figure 14:
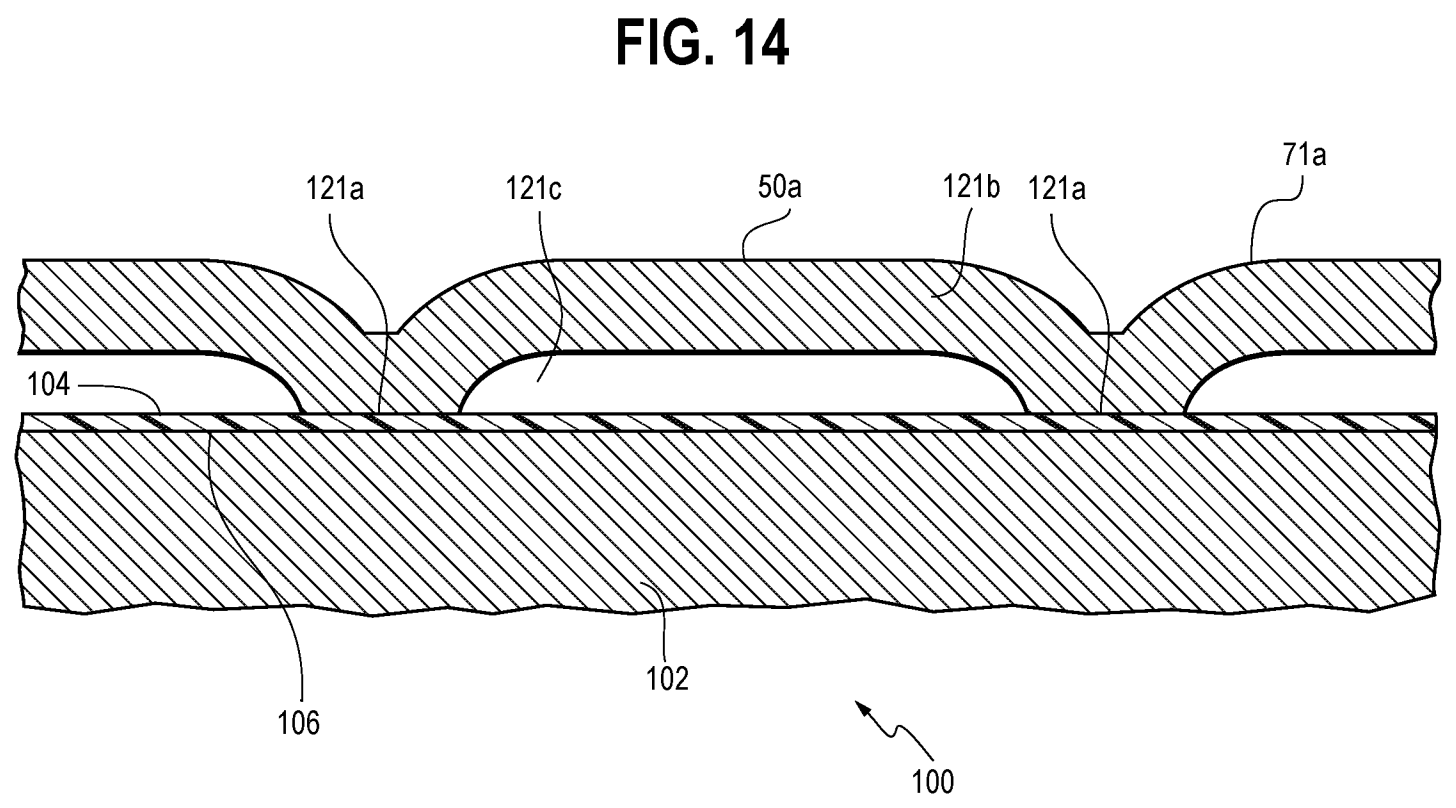

Referring next to FIG. 9, a chip 100 that implements an example of the NLTL 40 is illustrated. FIGS. 13-15 illustrate the vertical stack-up of the chip 100. The chip 100 comprises a semi-insulating substrate 102 that may comprise, for example, a 4 mil GaAs planar member. A dielectric layer 104 is formed at least in part on an upper surface 106 of the substrate 102. Various components are formed on the substrate 102 and/or dielectric layer 104 comprising the diodes 48, the inductors 50, and the main transmission line portions 52. In the illustrated embodiment, the various elements on the chip 100 are interconnected with one another by conductive traces. Specifically, each of the main transmission line portions 52, for example, the line portion 52*b* as seen in FIG. 10, comprises segments 52*b*-1 and 52*b*-2 formed by conductive traces disposed on the dielectric layer 104 wherein the segments 52*b*-1 and 52*b*-2 are disposed at an angle, such as 90 degrees, with respect to one another. The main transmission line portions 52*a*-52M are arranged in a back-and-forth fashion at a center portion of the substrate 102 and the diodes 48 and inductors 71 are disposed at outer portions of the substrate 102. A compact chip 100 is thus obtained.

The diodes 48 are of similar or identical construction to one another, except possibly as to size, and hence, only the diode 48*a* will be described in detail herein. As shown in FIGS. 3 and 13, the diode 48*a* includes a cathode 110*a* coupled to the junction 46*a* and an anode 112*a* coupled to a first end 114*a* of the inductor 50*a*. Each cathode 110 includes a cathode contact (FIG. 13) 115 disposed in contact between a subcathode layer 116 and a first interconnect 117 made of a suitable electrically conductive metal. For example, the cathode contact 115 and the subcathode layer 116 could be made of an AuGeNiAu metal alloy and a highly Si-doped GaAs epi layer, respectively. A cathode layer 118 is disposed in contact atop the subcathode layer 116 and an anode layer 119 is disposed in contact atop the cathode layer 118. The cathode layer 118 and the anode layer 119 are made of semiconductor materials that are doped to obtain the desired diode operating characteristics. A second interconnect 120 made of a suitable electrically conductive metal is disposed in contact atop the anode layer 119. The first interconnect 117 and the second interconnect 120 comprise the cathode and anode, respectively, of the diode 48 and are connected by conductive traces between the junction 46*a* and the inductor 71*a* on the chip 100.

Figure 11:
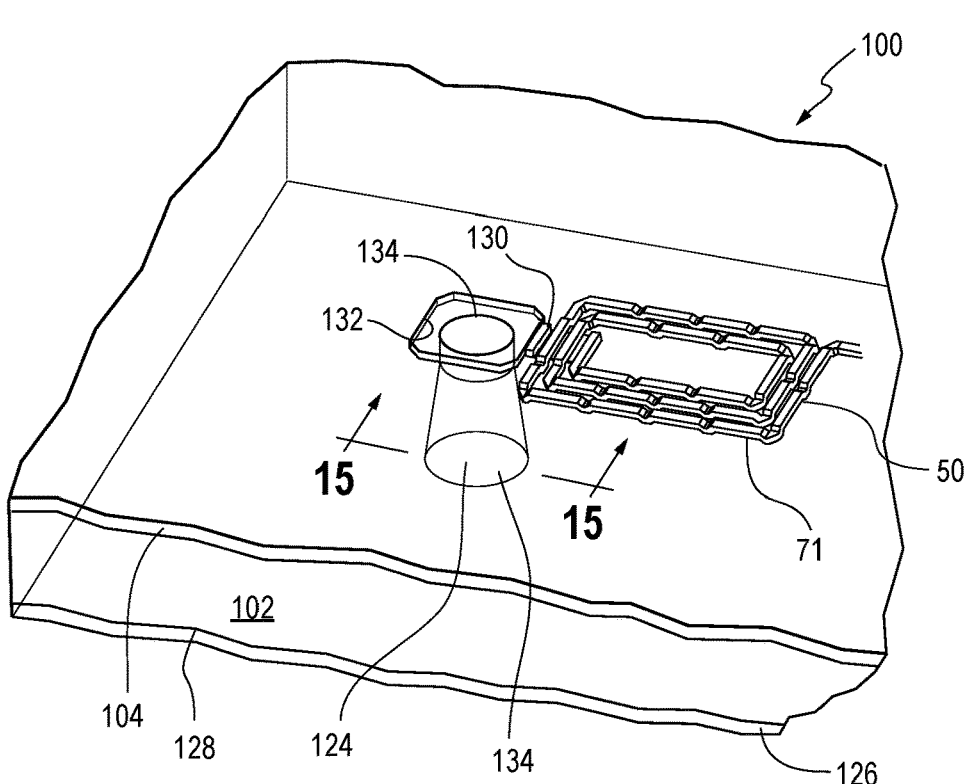
FIG. 11 is an enlarged, fragmentary, isometric view taken from above and with portions shown as transparent of the chip of FIG. 9.
Figure 12:
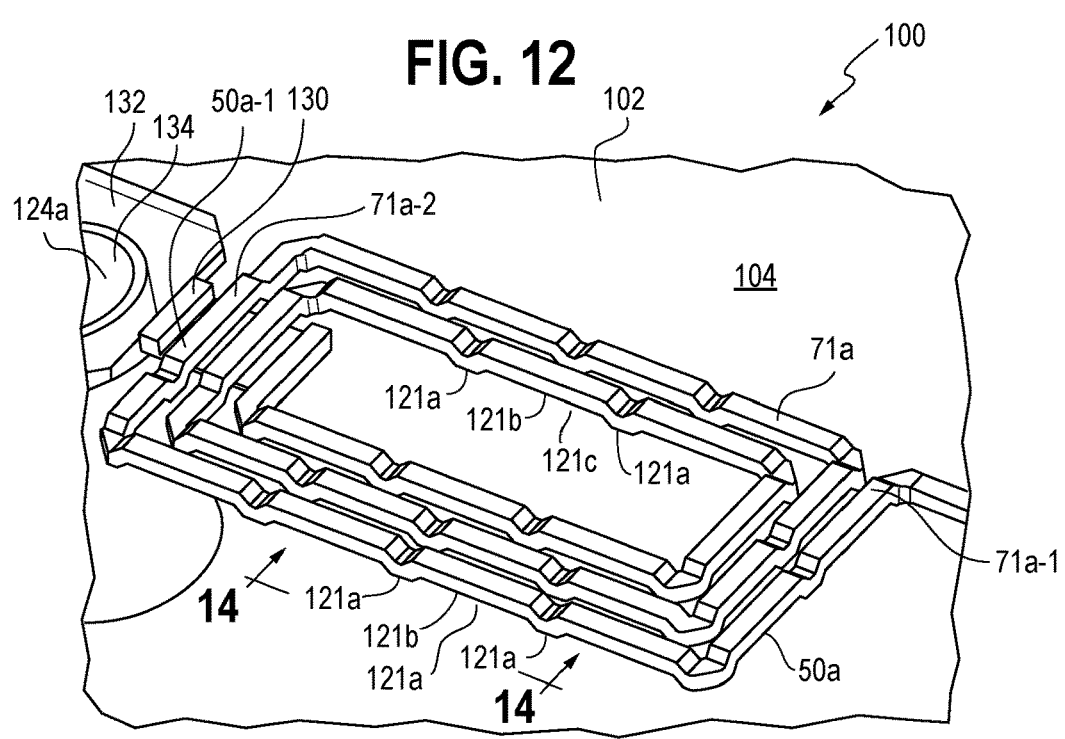
FIG. 12 is an enlarged, fragmentary, isometric view taken from above and with portions shown as transparent of the chip of FIG. 9.

The inductors 71 are also of similar or identical construction to one another, and hence, only the inductor 71*a* will be described in detail herein. Referring also to FIGS. 11, 12, and 14, the inductor 71*a* includes first portions 121*a* of inductor turns in contact with and disposed on the dielectric layer 104 on a first side of the chip 100 and second portions 121*b* of inductor turns between the first portions 121*a* that are disposed above the substrate 102 and the dielectric layer 104 such that a space 121*c* is formed between each second portion and the dielectric layer 104. Thus, a majority of each spiral inductor 71 comprising the second portions 121*b* thereof is air-bridged, i.e., a majority of the metal line sections forming each inductor 71 are raised above the upper or front surface of the chip 100 (i.e., above the dielectric layer 104) by about 3.5 micrometer. This is to increase the Q factor (i.e., lower the loss) of the spiral inductor and push the self-resonance frequency higher.

In the illustrated embodiment, the first ends 71*a*-1, 71*b*-1, . . . , 71M-1 corresponding to the ends 114*a*, 114*b*, 114*c*, . . . , 114M, respectively (FIG. 3) of the inductors 71*a*, 71*b*, . . . , 71M, respectively, are coupled directly to the diodes 48*a*, 48*b*, . . . , 48M, respectively, and second ends 71*a*-2, 71*b*-2, . . . , 71M-2 corresponding to the ends 122*a*, 122*b*, . . . , 122M (FIG. 3) of the inductors 71*a*, 71*b*, . . . , 71M are coupled by similar or identical conductive vias 124*a*, 124*b*, . . . , 124M, respectively, to a conductive ground plane 126 disposed on a back side 128 of the chip 100. Inasmuch as the vias 124 are identical to one another only the via 124*a* will be described in detail herein. As seen in FIGS. 12 and 15, a second end 71*a*-2 of an inductor 71*a* is coupled by a top metal portion 130 (also seen in FIG. 9) and an interconnect metal portion 132 to a tapered metal via portion 134 that extends through the dielectric layer 104 and the substrate 102. The tapered via portion 134 is integral with the ground plane 126.

In the illustrated embodiment of FIG. 9, input and output connectors 136, 138 are coupled to the input 58 and the output 60 of the NLTL 40, respectively.

By way of example, and not for purposes of limitation, estimated values of the components shown in FIG. 9 in which M=30 may be as follows (in the tables that follow diode sizes are specified in micrometers (μm) and refer to the diode diameter as shown in FIG. 9 and other FIGS., diode capacitance values are specified in picofarads (pF) and are measured at a reverse bias voltage of $V_d$=−0.6 volts, turns refer to the number of conductor turns making up the respective inductor, lengths (and other linear dimensions) are specified in μm and refer to the length e.g., the long dimension of the area enclosed by the inductor turns (or other respective linear dimension), and the inductive values are specified in nanohenries (nH):

TABLE 1

| Diode | Diameter | Cap. Value | Inductor | Turns | Length | Ind. Value |
|-------|----------|------------|----------|-------|--------|------------|
| 48a | 40 | 1.007 | 71a | 2.5 | 269.999 | 1.982 |
| 48b | 40 | 1.007 | 71b | 2.5 | 154.906 | 1.307 |
| 48c | 35 | 0.761 | 71c | 2.5 | 183.521 | 1.475 |
| 48d | 35 | 0.761 | 71d | 2.5 | 104.031 | 1.009 |
| 48e | 25 | 0.381 | 71e | 2.5 | 147.618 | 1.264 |
| 48f | 25 | 0.381 | 71f | 2.5 | 244.080 | 1.83 |
| 48g | 25 | 0.381 | 71g | 2.5 | 151.126 | 1.285 |
| 48h | 25 | 0.381 | 71h | 2.5 | 111.985 | 1.056 |
| 48i | 25 | 0.381 | 71i | 2.5 | 69.662 | 0.808 |
| 48j | 25 | 0.381 | 71j | 2.5 | 37.524 | 0.619 |
| 48k | 20 | 0.245 | 71k | 2.5 | 80.946 | 0.874 |
| 48l | 20 | 0.245 | 71l | 2.5 | 56.893 | 0.733 |
| 48m | 20 | 0.245 | 71m | 2.5 | 50.231 | 0.694 |
| 48n | 20 | 0.245 | 71n | 2.5 | 34.851 | 0.604 |
| 48o | 20 | 0.245 | 71o | 2.5 | 26.493 | 0.555 |
| 48p | 20 | 0.245 | 71p | 2.5 | 18.132 | 0.506 |
| 48q | 15 | 0.142 | 71q | 2.5 | 54.394 | 0.718 |
| 48r | 15 | 0.142 | 71r | 2.5 | 54.899 | 0.721 |
| 48s | 15 | 0.142 | 71s | 2.5 | 53.415 | 0.712 |
| 48t | 15 | 0.142 | 71t | 2.5 | 49.977 | 0.692 |
| 48u | 15 | 0.142 | 71u | 2.5 | 41.285 | 0.641 |
| 48v | 15 | 0.142 | 71v | 2.5 | 37.280 | 0.618 |
| 48w | 10 | 0.065 | 71w | 2.5 | 85.954 | 0.903 |
| 48x | 10 | 0.065 | 71x | 2.5 | 89.879 | 0.926 |
| 48y | 10 | 0.065 | 71y | 2.5 | 90.000 | 0.927 |
| 48z | 10 | 0.065 | 71z | 2.5 | 88.455 | 0.918 |
| 48M-3 | 10 | 0.065 | 71M-3 | 2.5 | 84.448 | 0.894 |
| 48M-2 | 10 | 0.065 | 71M-2 | 2.5 | 30.040 | 0.575 |
| 48M-1 | 10 | 0.065 | 71M-1 | 2.5 | 77.767 | 0.855 |
| 48M | 10 | 0.065 | 71M | 2.5 | 65.250 | 0.782 |

Further, in an embodiment, the width of each area enclosed by a set of inductor turns (i.e., in the side-to-side dimension as seen in FIGS. 9 and 10) is 48 μm.

Figure 7:
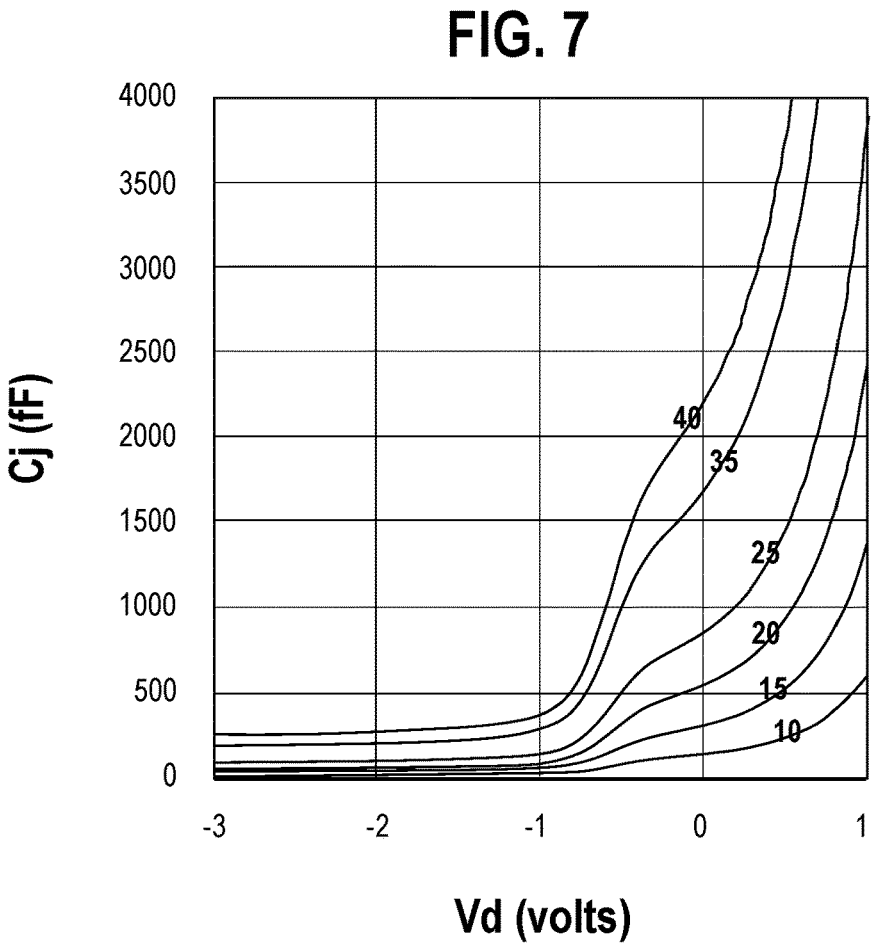
FIG. 7 is a graph of capacitance versus voltage for each of the diodes of FIG. 3.

FIG. 7 comprises a graph of six curves 69a-69f representing reverse bias voltage Vd versus capacitance in femtofarads (fF) for the diodes 48 of FIG. 9 summarized in Table 1 above of sizes 40 mm, 35 mm, 25 mm, 20 mm, 15 mm, and 10 mm, respectively.

Figures 16, 17:
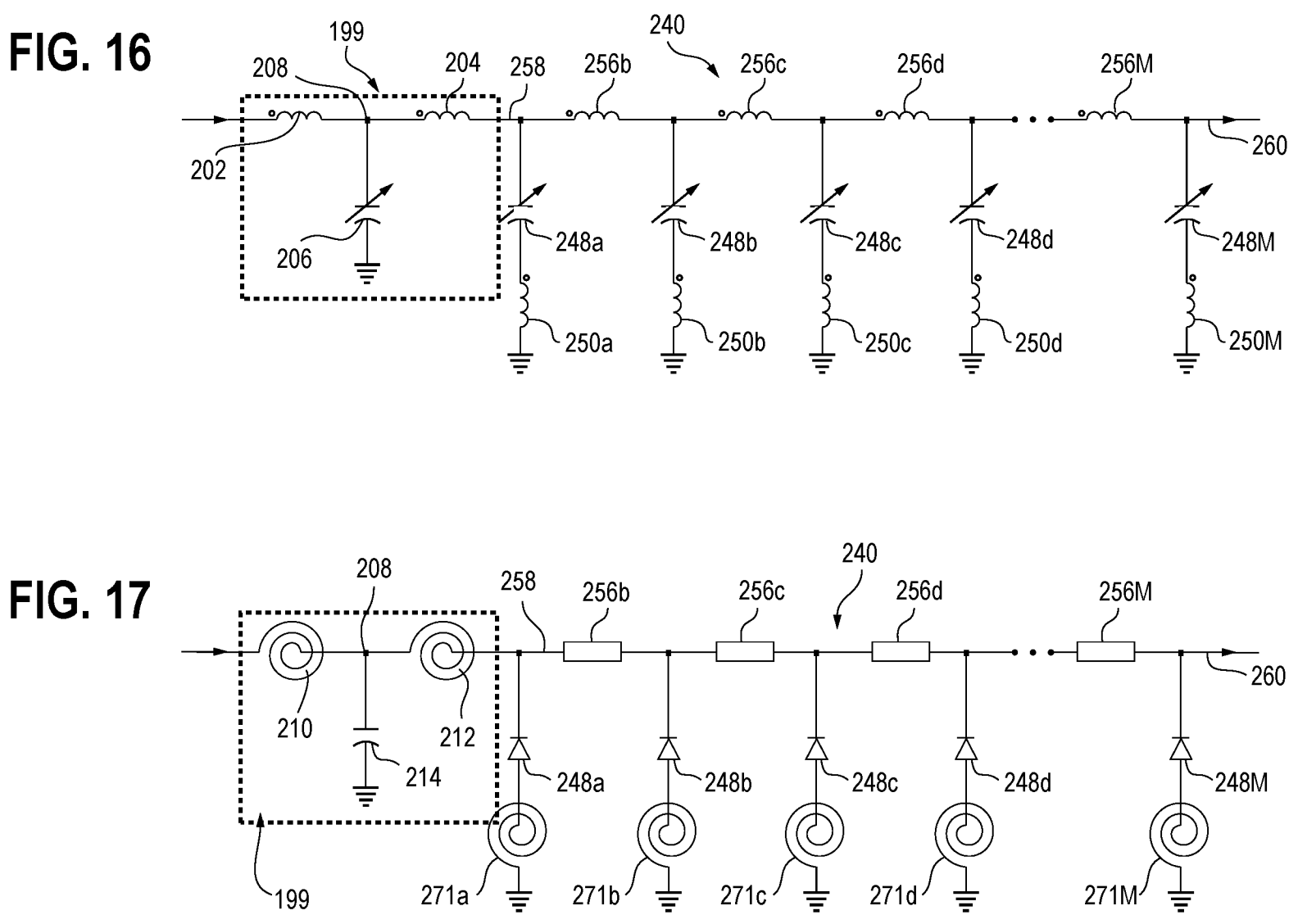

Referring next to FIG. 16, in an embodiment, additional elements are provided as part of or separate from the NLTL 40 (and/or any other NLTL disclosed herein) that are coupled upstream and/or downstream of the above-described components of the NLTL 40. FIG. 16 shows an NLTL 240 that has a topology identical in part to the NLTL 40, but which may have different diode sizes and impedance values compared thereto. Elements in FIGS. 16, 17, and 17A corresponding to elements in FIGS. 3, 5, 6, and 9 (except, possibly, as to diode sizes and impedance values and/or as otherwise described herein) are identified by the same reference numbers of FIGS. 3, 5, 6, and 9 increased by 200 (thus, e.g., the element 56b of FIGS. 3, 5, 6, and 9 corresponds to the element 256b of FIGS. 16, 17, and 17A, the element 48a of FIGS. 3, 5, 6, and 9 corresponds to the element 248a of FIGS. 16, 17, and 17A the element 50M of FIG. 3 corresponds to the element 250M of FIG. 16, etc.). As seen in FIG. 16, a low-pass filter 199 is coupled upstream of the input 258 of the NLTL 240 The low-pass filter 199 comprises first and second series-connected inductors 202, 204 and a capacitor 206 coupled between a source of voltage potential, such as ground, and a junction 208 between the inductors 202, 204.

Figure 17A:
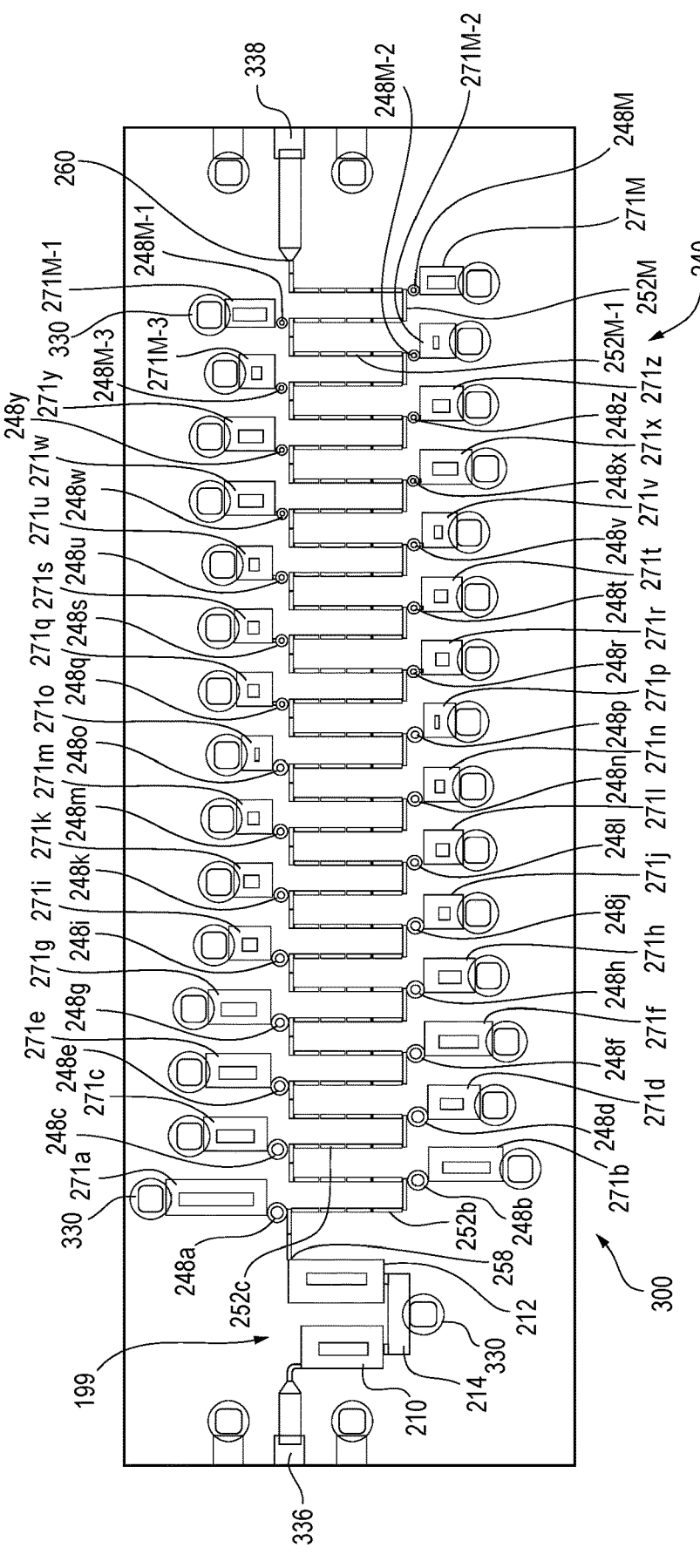
FIG. 17A is a plan view of a chip implementing the NLTL of FIG. 17.
Figure 17B:
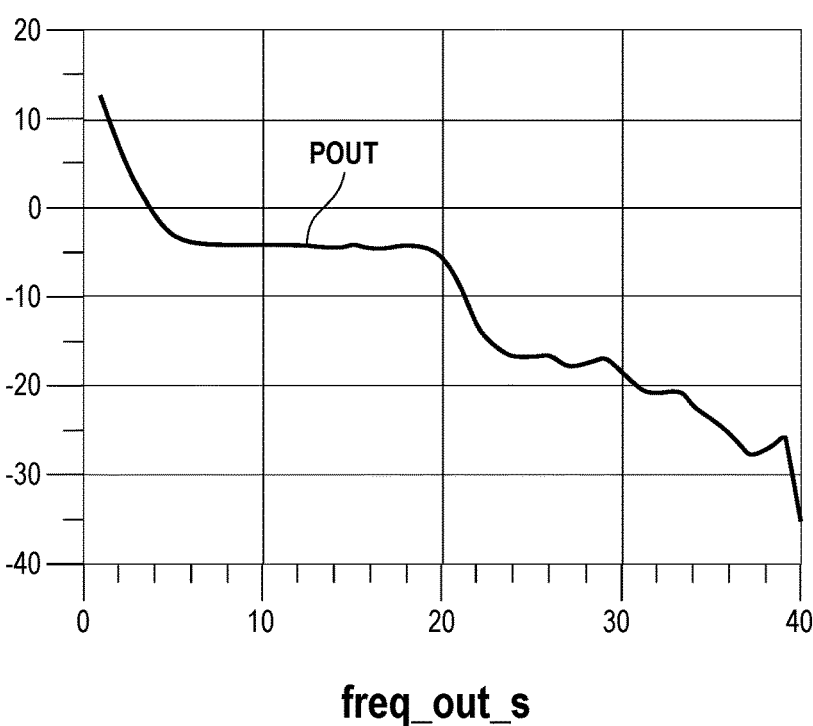
FIGS. 17B, 21, 23, and 27 are graphs of output power versus frequency of the NLTL's of FIGS. 17A, 20, 22, and 26, respectively.
Figure 17C:
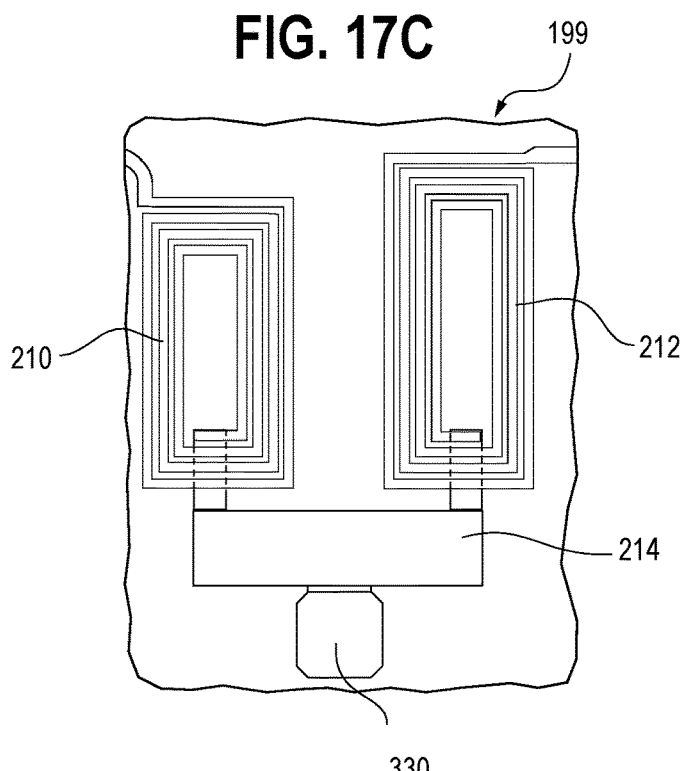
FIG. 17C is an enlarged, fragmentary, plan view of a portion of the chip of FIG. 17A.

FIG. 17 illustrates a realization of the embodiment of FIG. 16 in which the NLTL 240 is realized by diodes 248 and spiral inductors 271 similar or identical to the diodes 48 and inductors 71, respectively, of FIG. 5 or 6. The low-pass filter 199 is realized by first and second spiral inductors 210, 212 and a first MIM (metal-insulator-metal) capacitor 214, (the capacitor 214 is described in detail in connection with FIG. 28 hereinafter) that comprise the inductors 202, 204 and the capacitor 206, respectively. As should be evident to one of ordinary skill in the art, the low-pass filter 199 may be realized by other elements. FIG. 17A illustrates a chip 300 that may have a similar or identical topology to the chip 100 except that the inductors 210, 212 and the capacitor 206 are provided upstream of the NLTL 240. The chip 300 may implement the embodiment of FIG. 17. The components of the low-pass filter 199 comprising the inductors 210, 212 and the capacitor 214 are shown in enlarged detail in FIG. 17C. It may be noted that in FIG. 17A, the inductors and capacitor in the input low-pass filter 199 may be optimized simultaneously with the diode sizes and shunt inductor sizes in the NLTL 240. Typically, the resultant (optimized) diode sizes and shunt inductor sizes in FIG. 17A are different from the optimized sizes in FIG. 9. This can be understood by considering the following. The harmonic waves generated by the diodes travel in the NLTL in both directions toward the chip input and the chip output. With an input filter like that in FIG. 17A, the harmonic waves travelling toward the chip input are reflected by the low-pass filter 199 and travel down the main transmission line toward the chip output where they interact with the diodes again. Without an input filter, like that in FIG. 9, the harmonic waves travelling toward the chip input see no obstacle, such as the low-pass filter, and continue to travel toward the chip input until eventually exiting the chip through the chip input. Thus, the input low-pass filter 199: 1) provides better impedance match at the fundamental frequency; 2) blocks harmonics from leaking through the chip input and contaminating (i.e., impacting) circuitry coupled to the chip input; and 3) sends the reflected harmonics down the line for producing more harmonic output power (i.e, to accomplish "energy re-use".) The input low-pass filter 199 can be of any type as long as it serves the purposes of 1), 2), and 3) above. For example, the input low pass filter 199 could be a more sophisticated LC (i.e., inductor-capacitor) ladder such as L-C-L-C-L, or a sequence of transmission line segments with alternating high- and low-impedances. For the same reason, the low-pass filter can be replaced by a bandpass filter whose passband covers the input fundamental tone. Thus, e.g., a bandpass filter could be used with pass band of 0.5 to 1.5 GHz., which allows transmission of a fundamental tone of 1 GHz. and prevents all harmonics from leaking out of the input of the NLTL. It may be noted that there is no inductor 256a that would otherwise be shown in FIG. 17 and FIG. 17A (nor is there a corresponding inductor shown in other schematics of embodiments that include a low-pass filter coupled to the input of an NLTL described hereinafter) inasmuch as the inductance represented by such inductor and any inductance upstream of the input 258 is/are included as part of the inductor 204 and such impedance is taken into account during initial design and design refinement By way of example, and not for purposes of limitation, estimated values of the components shown in FIG. 17A in which M=30 may be as follows:

TABLE 2

| Diode | Diameter | Cap. Value | Inductor | Turns | Length | Ind. Value |
|-------|----------|------------|----------|-------|--------|------------|
| 248a | 40 | 1.007 | 271a | 2.5 | 248.057 | 1.853 |
| 248b | 40 | 1.007 | 271b | 2.5 | 157.624 | 1.323 |
| 248c | 35 | 0.761 | 271c | 2.5 | 123.566 | 1.112 |
| 248d | 35 | 0.761 | 271d | 2.5 | 79.635 | 0.866 |

TABLE 2-continued

| Diode | Diameter | Cap. Value | Inductor | Turns | Length | Ind. Value |
|---|---|---|---|---|---|---|
| 248e | 25 | 0.381 | 271e | 2.5 | 136.192 | 1.120 |
| 248f | 25 | 0.381 | 271f | 2.5 | 135.703 | 1.120 |
| 248g | 25 | 0.381 | 271g | 2.5 | 123.001 | 1.112 |
| 248h | 25 | 0.381 | 271h | 2.5 | 80.058 | 0.869 |
| 248i | 25 | 0.381 | 271i | 2.5 | 56.859 | 0.733 |
| 248j | 25 | 0.381 | 271j | 2.5 | 41.885 | 0.645 |
| 248k | 20 | 0.245 | 271k | 2.5 | 47.487 | 0.678 |
| 248l | 20 | 0.245 | 271l | 2.5 | 49.182 | 0.688 |
| 248m | 20 | 0.245 | 271m | 2.5 | 40.596 | 0.637 |
| 248n | 20 | 0.245 | 271n | 2.5 | 31.628 | 0.585 |
| 248o | 20 | 0.245 | 271o | 2.5 | 18.688 | 0.509 |
| 248p | 20 | 0.245 | 271p | 2.5 | 13.16 | 0.476 |
| 248q | 15 | 0.142 | 271q | 2.5 | 50 | 0.692 |
| 248r | 15 | 0.142 | 271r | 2.5 | 51.253 | 0.700 |
| 248s | 15 | 0.142 | 271s | 2.5 | 52.624 | 0.708 |
| 248t | 15 | 0.142 | 271t | 2.5 | 50.397 | 0.695 |
| 248u | 15 | 0.142 | 271u | 2.5 | 39.9 | 0.633 |
| 248v | 15 | 0.142 | 271v | 2.5 | 27.291 | 0.559 |
| 248w | 10 | 0.065 | 271w | 2.5 | 84.564 | 0.895 |
| 248x | 10 | 0.065 | 271x | 2.5 | 86.037 | 0.904 |
| 248y | 10 | 0.065 | 271y | 2.5 | 83.609 | 0.889 |
| 248z | 10 | 0.065 | 271z | 2.5 | 59.543 | 0.748 |
| 248M-3 | 10 | 0.065 | 271M-3 | 2.5 | 41.839 | 0.645 |
| 248M-2 | 10 | 0.065 | 271M-2 | 2.5 | 26.102 | 0.552 |
| 248M-1 | 10 | 0.065 | 271M-1 | 1.5 | 117.32 | 0.455 |
| 248M | 10 | 0.065 | 271M | 1.5 | 90.317 | 0.383 |

In addition to the foregoing, the low-pass filter 199 may have an approximate cut-off frequency of 1.3 GHz., the inductors 210, 212 may have approximate inductive values of 2.6 nH and 3.0 nH, respectively, and the capacitor 214 may have an approximate capacitive value of 5.1 pF.

The diodes 248 and the inductance values of the inductors 271 are tuned or optimized to obtain a flattened frequency spectrum $P_{OUT}$ similar or identical to that shown in FIG. 17B in which the harmonic output power stops decreasing and instead remains at approximately the same level (plus or minus 1 dB) throughout a desired range of, for example, the $5^{th}$ through $19^{th}$ harmonics. Further, $P_{OUT}$ has a higher output power level in the flattened range compared to the corresponding flattened range portion of the curve of FIG. 4.

Figure 18:
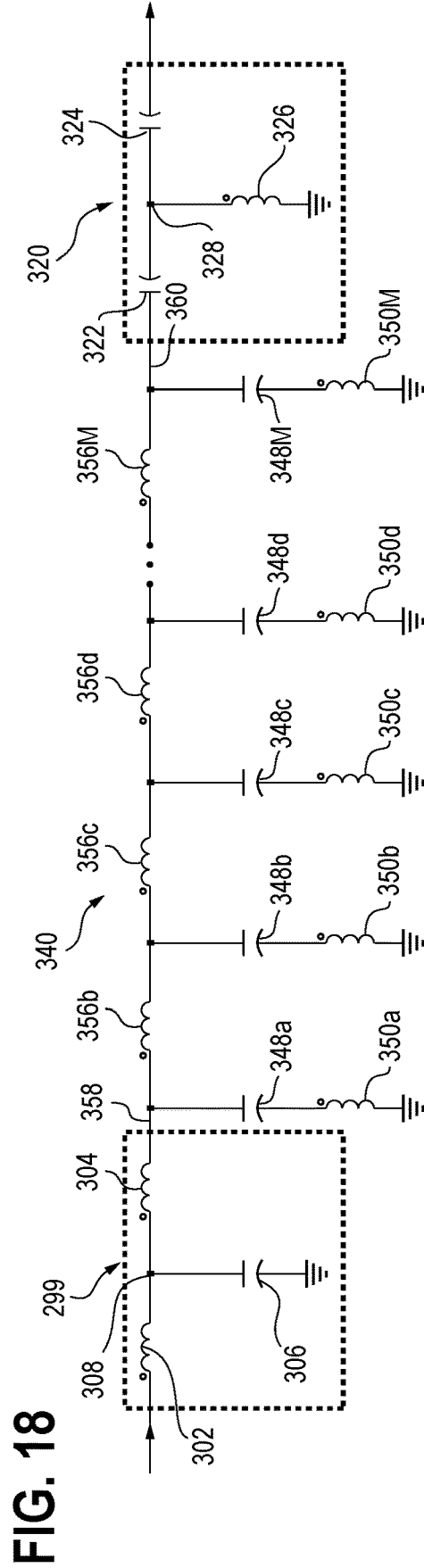
Figure 19:
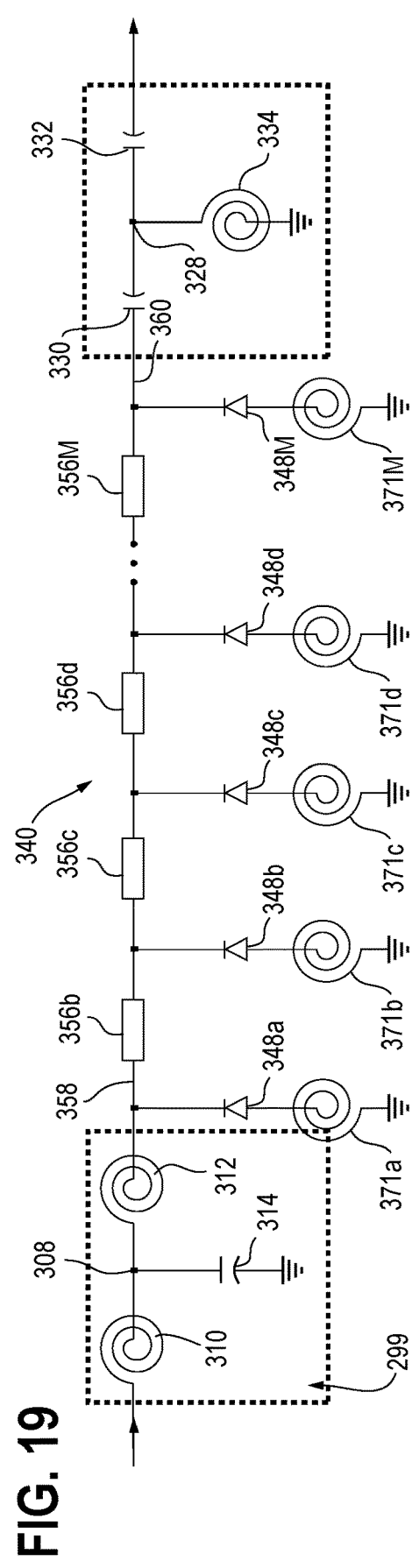

Additionally or alternatively, a high-pass filter 320 may be coupled downstream to the output of an the NLTL 340. FIG. 18 shows an NLTL 340 that has a topology identical in part to the NLTL 240, but which may have different diode sizes and impedance values compared thereto. Elements in FIGS. 18-20B that correspond to those shown in FIGS. 16, 17, and 17A (except, possibly, as to impedance value and/or as otherwise described herein) are identified by the same reference number of FIGS. 16, 17, and 17A increased by 100. The high-pass filter 320 is coupled to an output 360 of the NLTL 340 and comprises first and second series-connected capacitors 322, 324 and an inductor 326 coupled between the source of voltage potential (e.g., ground) and a junction 328 between the capacitors 322, 324. The high-pass filter coupled to the output of the NLTL 340 limits or eliminates leak-through of the fundamental frequency and reflects the fundamental frequency back toward an input where it interacts with the diodes again for harmonic generation, i.e, to realize "energy re-use." The output high-pass filter 320 works with a low-pass filter 299 (that is similar or identical to the low-pass filter 199) to form arbitrary selected frequencies in, for example, band-pass fashion. In fact, the output filter 320 need not comprise a C-L-C high pass filter; rather, the filter 320 could be a different type of filter as long as the filter serves to block the fundamental and pass the desired harmonics. For example, the filter 320 can be a more sophisticated LC ladder such as C-L-C-L-C, or a bandpass filter where the passband covers the desired harmonics frequencies.

FIC. 19 illustrates a realization of FIG. 18 in which the high-pass filter 320 is embodied by second and third MIM capacitors 330, 332 and a third spiral inductor 334 that comprise the capacitors 322, 324 and the inductor 326, respectively. The high-pass filter 320 may be realized by other elements as should be evident to one of ordinary skill in the art.

Referring next to FIGS. 20A-20D, a third chip 400 similar or identical to the chip 300 except as noted hereinafter is illustrated. The chip 400 implements the NLTL 340, such as that shown in FIGS. 18 and 19, in which the lengths and widths of the transmission line portions 352 are all equal and hence the impedances 356a, 356b, . . . , 356M are all equal. Further, the chip 400 includes the low-pass filter 299 realized by the spiral inductors 310, 312 and the first MIM capacitor 314, wherein the low-pass filter 299 is coupled between an input connector 436 of the chip 400 and an input 358 of the NLTL 340. Still further, and as seen in enlarged detail in FIG. 20B, the chip 400 includes the high-pass filter 320 realized by the second and third MIM capacitors 330, 332 and the third spiral inductor 334 wherein the high-pass filter 320 is coupled between an output 360 of the NLTL 340 and an output connector 438 of the chip 400.

Figure 20A:
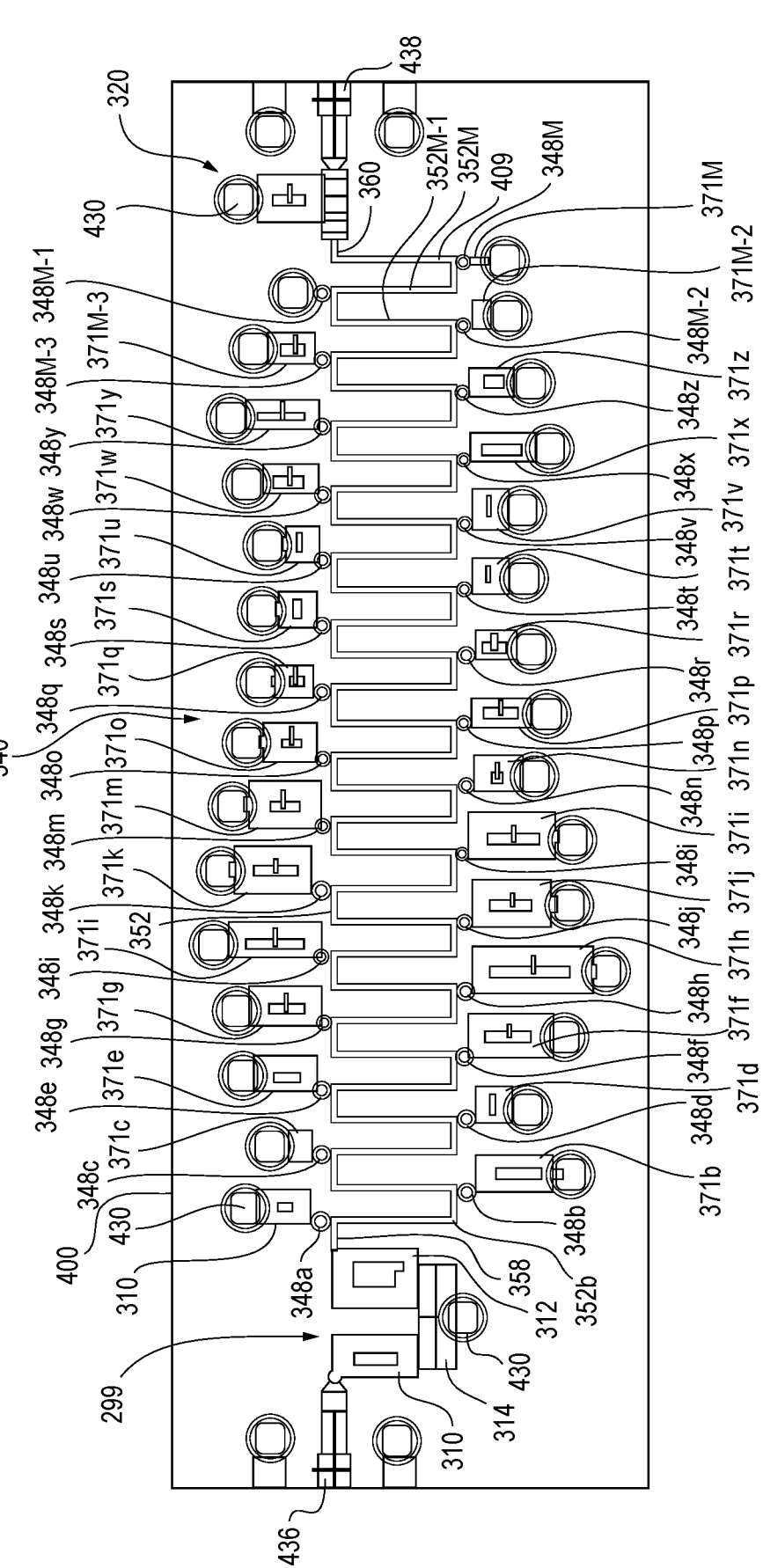
FIGS. 20A, 22, and 26A are plan views of embodiments of chips implementing various embodiments of NLTL's.
Figure 20B:
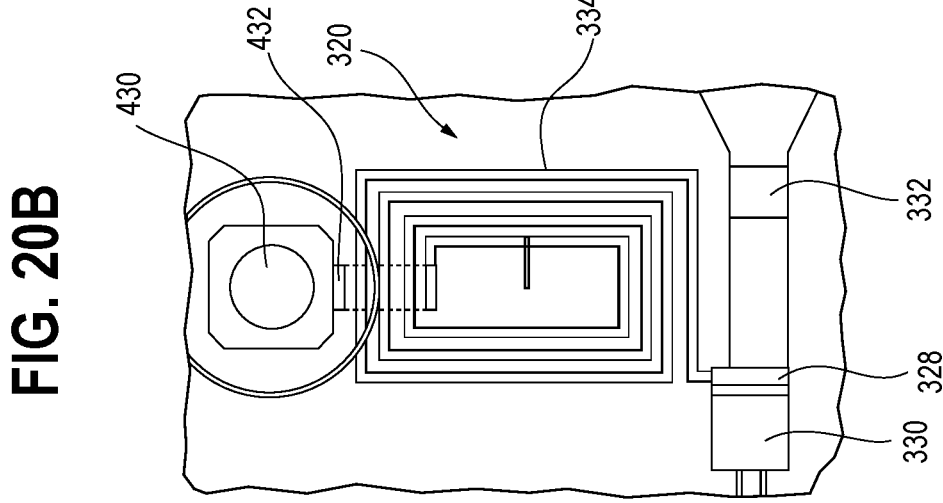
FIGS. 20B, 20C, and 20D are enlarged, fragmentary, plan views of portions of the chip of FIG. 20A.

It may be desirable to design the chip 400 such that the input connector 436 and the output connector 438 are disposed at the same Y-position (i.e., along the width from top to bottom of the chip 400 as illustrated in FIG. 20A), resulting in the need to include a transmission line portion 409 between the diode 348M and the capacitor 330. The impedance of the transmission line portion 409 is taken into account during initial design and design refinement.

By way of example, and not for purposes of limitation, estimated values of the components shown in FIG. 20A in which M=30 may be as follows:

TABLE 3

| Diode | Diameter | Cap. Value | Inductor | Turns | Length | Ind. Value |
|---|---|---|---|---|---|---|
| 348a | 45 | 1.281 | 371a | 2.5 | 60 | 0.789 |
| 348b | 45 | 1.281 | 371b | 2.5 | 157 | 1.356 |
| 348c | 45 | 1.281 | 371c | 1.5 | 11 | 0.193 |
| 348d | 31 | 0.595 | 371d | 2.5 | 26 | 0.570 |
| 348e | 14 | 0.130 | 371e | 2.5 | 102 | 1.040 |
| 348f | 8 | 0.053 | 371f | 3.5 | 142 | 2.384 |
| 348g | 8 | 0.049 | 371g | 2.5 | 125 | 1.178 |
| 348h | 21 | 0.282 | 371h | 3.5 | 262 | 3.535 |
| 348i | 9 | 0.062 | 371i | 2.5 | 203 | 1.620 |
| 348j | 23 | 0.323 | 371j | 3.5 | 138 | 2.344 |
| 348k | 22 | 0.309 | 371k | 3.5 | 141 | 2.375 |
| 348l | 8 | 0.049 | 371l | 3.5 | 167 | 2.642 |
| 348m | 8 | 0.049 | 371m | 3.5 | 117 | 2.121 |
| 348n | 30 | 0.556 | 371n | 2.5 | 56 | 0.764 |
| 348o | 21 | 0.269 | 371o | 2.5 | 77 | 0.890 |
| 348p | 22 | 0.295 | 371p | 1.5 | 127 | 0.524 |
| 348q | 26 | 0.431 | 371q | 1.5 | 59 | 0.322 |
| 348r | 24 | 0.352 | 371r | 1.5 | 80 | 0.397 |
| 348s | 17 | 0.176 | 371s | 2.5 | 42 | 0.673 |
| 348t | 18 | 0.197 | 371t | 2.5 | 30 | 0.596 |
| 348u | 19 | 0.232 | 371u | 2.5 | 20 | 0.531 |
| 348v | 17 | 0.187 | 371v | 2.5 | 31 | 0.602 |
| 348w | 19 | 0.220 | 371w | 1.5 | 110 | 0.480 |
| 348x | 18 | 0.197 | 371x | 1.5 | 142 | 0.564 |
| 348y | 18 | 0.208 | 371y | 1.5 | 160 | 0.611 |
| 348z | 22 | 0.295 | 371z | 1.5 | 81 | 0.400 |
| 348M-3 | 19 | 0.220 | 371M-3 | 1.5 | 84 | 0.408 |

TABLE 3-continued

| Diode | Diameter | Cap. Value | Inductor | Turns | Length | Ind. Value |
|---|---|---|---|---|---|---|
| 348M-2 | 15 | 0.139 | 371M-2 | 1.5 | 10 | 0.189 |
| 348M-1 | 19 | 0.220 | 371M-1 | 0.5 | 12 | 0.010 |
| 348M | 10 | 0.073 | 371M | 0.5 | 75 | 0.065 |

As an example, the chip 400 of FIG. 20A has an input low-pass filter 299 comprising capacitor 314=6.4 pF, inductor 310=2.6 nH, inductor 312=3.4 nH, and having a cut-off frequency of 1.1 GHz., and further has an output high-pass filter 320 comprising capacitors 330, 332=0.6 pF, and =1.2 pF, respectively, and inductor 334=2.1 nH, with a cut-off frequency of 2.7 G-z.

Figure 20D:
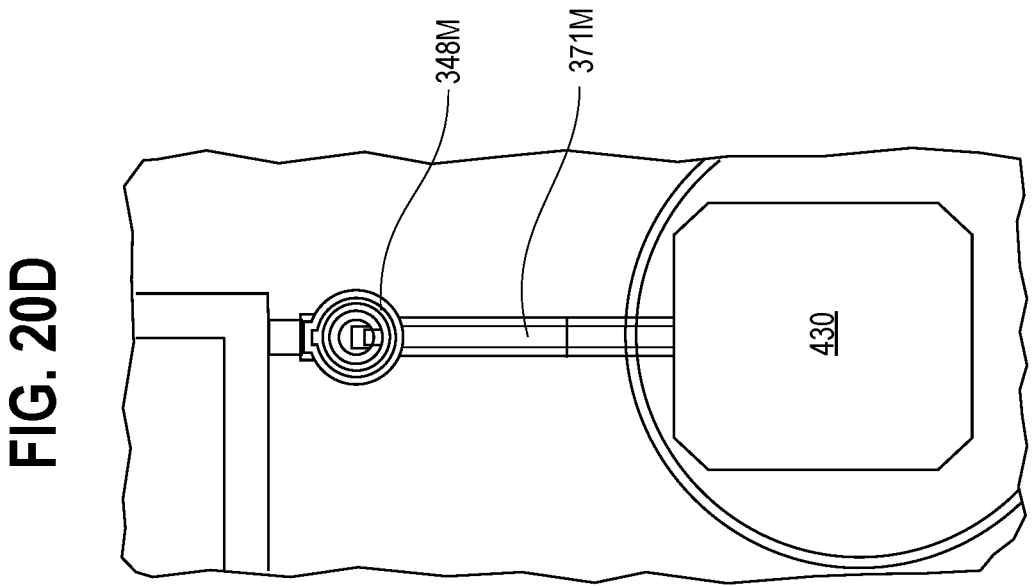
Figure 20C:
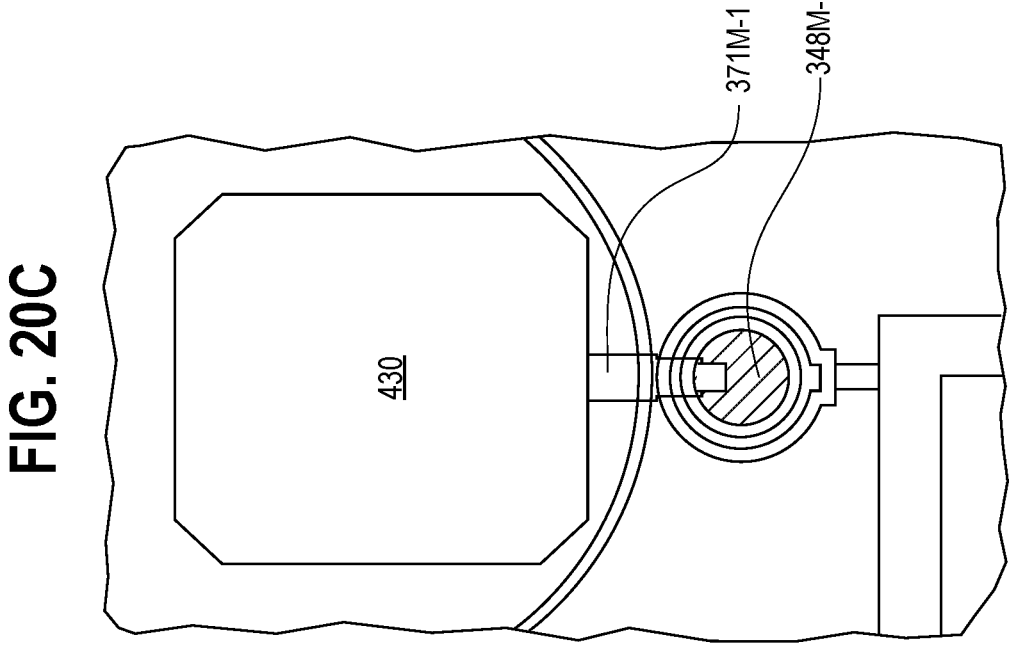

It may be the case that a required inductive value is so small that less than a full inductor turn provides enough inductive value for a shunt path. In such a case, the required inductive value may be supplied by a straight conductive line of selected length, for example, as shown in FIGS. 20C and 20D. Such straight-line inductors may be thought of as comprising one-half conductor turns, and inductors 371M-1 and 371M are so indicated as having 0.5 turns in Table 3 above.

Figure 21:
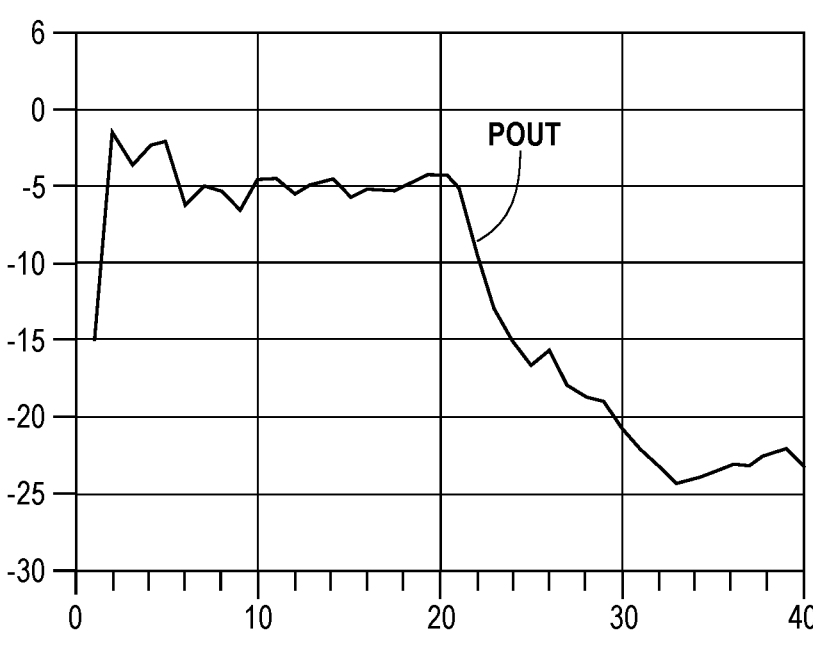

FIG. 21 illustrates harmonic generation as a function of magnitude for the NLTL 340 implemented by the chip 300 of FIG. 20A. The magnitude of the fundamental is at a low level and rises up to approximately the second harmonic. Thereafter, the magnitude remains approximately constant at about −2 dBm until the fifth or sixth harmonic and then drops to approximately −5 dBm. The magnitude stays approximately constant between about the $6^{th}$ and $20^{th}$ harmonics and drops off above the $20^{th}$ harmonic.

Figure 22:
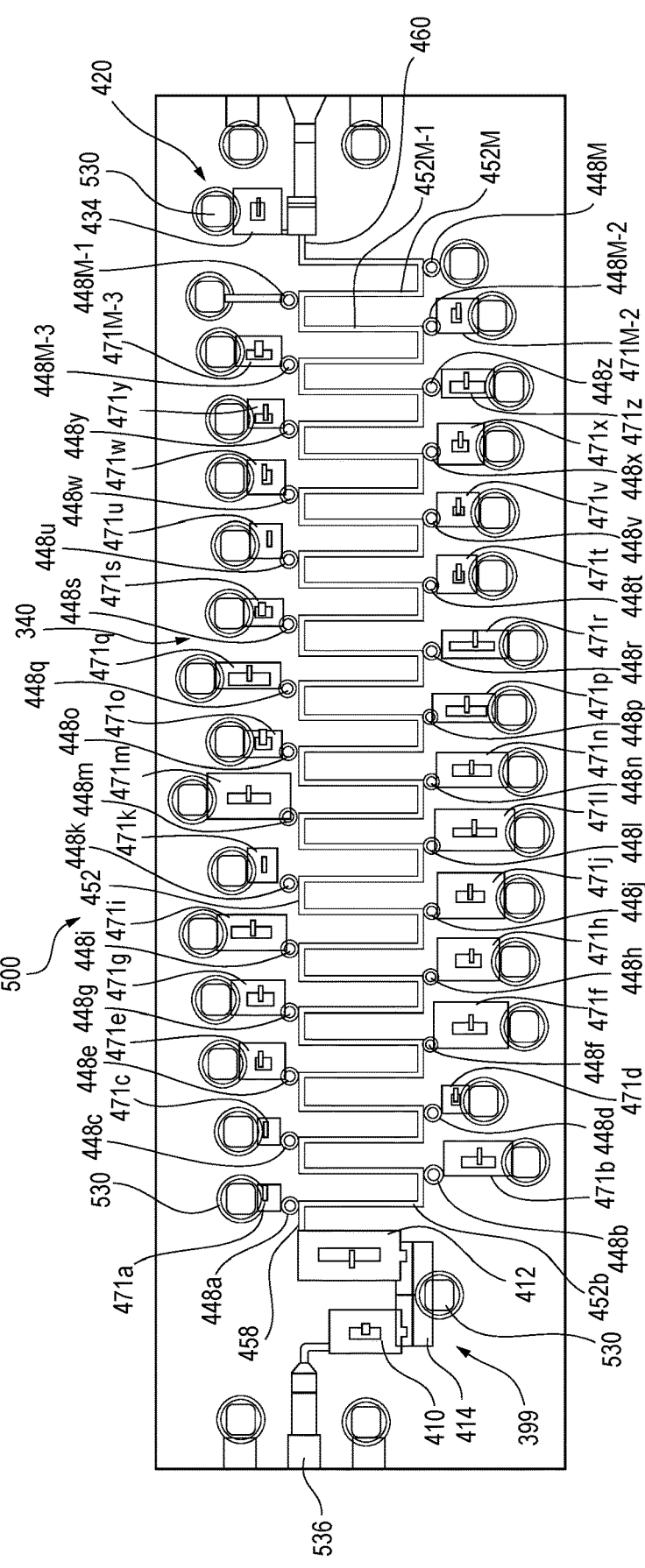

Referring next to FIG. 22, a third chip 500 similar or identical to the chip 400 except as to diode sizes and impedance values of elements is illustrated. As with the chip 400, the chip 500 implements the NLTL 340, such as that shown in FIGS. 18 and 19. Elements in FIG. 22 that correspond to those shown in FIGS. 18-20D) (except, possibly, as to diode sizes and impedance values and/or as otherwise described herein) are identified by the same reference number of FIGS. 18-20D increased by 100. By way of example, and not for purposes of limitation, estimated values of the components shown in FIG. 22 in which M=30 may be as follows:

TABLE 4

| Diode | Diameter | Cap. Value | Inductor | Turns | Length | Ind. Value |
|---|---|---|---|---|---|---|
| 448a | 45.0 | 1.281 | 471a | 1.5 | 19 | 0.224 |
| 448b | 45.0 | 1.281 | 471b | 2.5 | 123 | 1.164 |
| 448c | 45.0 | 1.281 | 471c | 1.5 | 10 | 0.189 |
| 448d | 36.0 | 0.800 | 471d | 1.5 | 32 | 0.263 |
| 448e | 18.0 | 0.100 | 471e | 2.5 | 66 | 0.825 |
| 448f | 10.0 | 0.000 | 471f | 3.5 | 128 | 2.239 |
| 448g | 10.0 | 0.000 | 471g | 2.5 | 101 | 1.034 |
| 448h | 20.5 | 0.250 | 471h | 3.5 | 91 | 1.862 |
| 448i | 13.0 | 0.100 | 471i | 2.5 | 139 | 1.253 |
| 448j | 20.5 | 0.250 | 471j | 3.5 | 100 | 1.962 |
| 448k | 36.5 | 0.800 | 471k | 2.5 | 20 | 0.531 |
| 448l | 8.0 | 0.040 | 471l | 3.5 | 147 | 2.431 |
| 448m | 8.0 | 0.040 | 471m | 3.5 | 144 | 2.403 |
| 448n | 18.5 | 0.200 | 471n | 2.5 | 138 | 1.249 |
| 448o | 33.5 | 0.690 | 471o | 1.5 | 60 | 0.345 |
| 448p | 11.5 | 0.080 | 471p | 1.5 | 140 | 0.560 |
| 448q | 27.0 | 0.440 | 471q | 1.5 | 160 | 0.611 |
| 448r | 27.0 | 0.440 | 471r | 1.5 | 160 | 0.611 |
| 448s | 32.5 | 0.600 | 471s | 1.5 | 60 | 0.345 |

TABLE 4-continued

| Diode | Diameter | Cap. Value | Inductor | Turns | Length | Ind. Value |
|---|---|---|---|---|---|---|
| 448t | 17.5 | 0.100 | 471t | 2.5 | 50 | 0.727 |
| 448u | 23.5 | 0.300 | 471u | 2.5 | 20 | 0.531 |
| 448v | 18.5 | 0.200 | 471v | 2.5 | 50 | 0.727 |
| 448w | 19.0 | 0.220 | 471w | 2.5 | 40 | 0.660 |
| 448x | 17.5 | 0.100 | 471x | 2.5 | 70 | 0.850 |
| 448y | 28.5 | 0.500 | 471y | 1.5 | 60 | 0.345 |
| 448z | 28.0 | 0.400 | 471z | 1.5 | 120 | 0.502 |
| 448M-3 | 31.5 | 0.610 | 471M-3 | 1.5 | 90 | 0.424 |
| 448M-2 | 21.5 | 0.200 | 471M-2 | 2.5 | 40 | 0.660 |
| 448M-1 | 25.0 | 0.380 | 471M-1 | 0.5 | 182 | 0.157 |
| 448M | 8.0 | 0.040 | 471M | 0.5 | 67 | 0.058 |

As an example, the chip 500 of FIG. 22 has an input low-pass filter 399 comprising capacitor 414=5.6 pF, inductor 410=2.1 nH, inductor 412=3.0 nH, and having a cut-off frequency of 1.2 GHz., and further has output high-pass filter 420 comprising capacitors 430, 432=0.2 pF, and =1.7 pF, respectively, and inductor 434=1.4 nH, with a cut-off frequency of 6.8 GHz.

Figure 23:
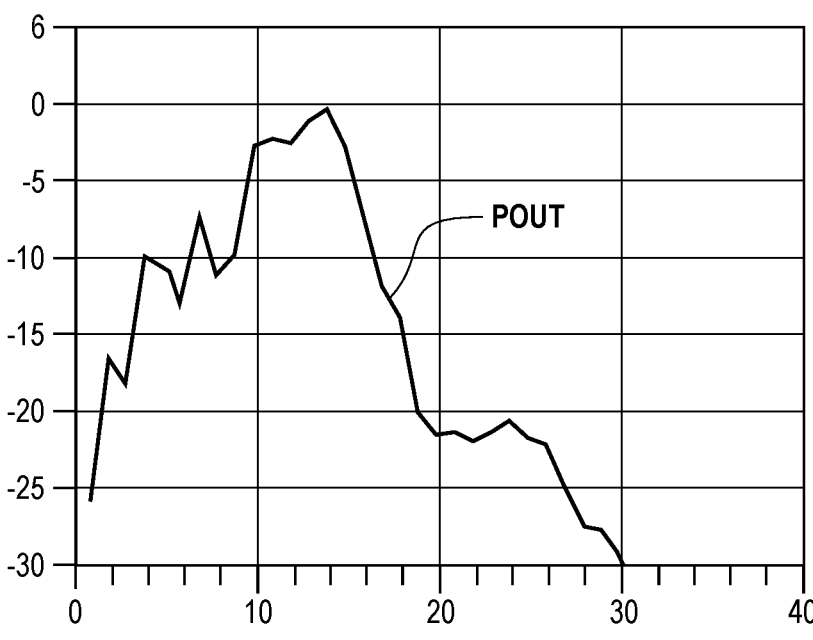

FIG. 23 illustrates output power as a function of frequency produced by the chip 500 in response to application of a 1 GHz. tone thereto. A comparison of FIG. 21 with FIG. 23 shows that a relatively wide bandpass characteristic (FIG. 21) can be achieved, or a relatively narrow pass band can be realized (FIG. 23), if desired. It may be noted that the NLTL implemented by the chip 500 as seen in FIG. 22 has the same main transmission line, same number of diodes (30), and same circuit topology (input filter, 30 diodes, output filter) as the chip 400 shown in FIG. 20. However, the optimized component values (diode sizes, inductor sizes, and capacitor sizes) are all different because the chips 400 and 500 are designed for different harmonic frequencies. (the chip 400 of FIG. 20 aims for 2 to 19 GHz. while the chip 500 of FIG. 22 targets 10 to 14 GHz.). It may be noted that the diodes in FIG. 20 and FIG. 22 work in different ways in that the phase and magnitude of each harmonic generated therein are different. Furthermore, the different diode sizes between FIG. 20 and FIG. 22 manifest the quantitatively different interactions among the diodes in each circuit. FIG. 23 illustrates that the fundamental and lower harmonics are suppressed and that the chip 360 develops increased magnitudes in a band-pass manner between approximately the $10^{th}$ and $14^{th}$ harmonics.

Figure 24:
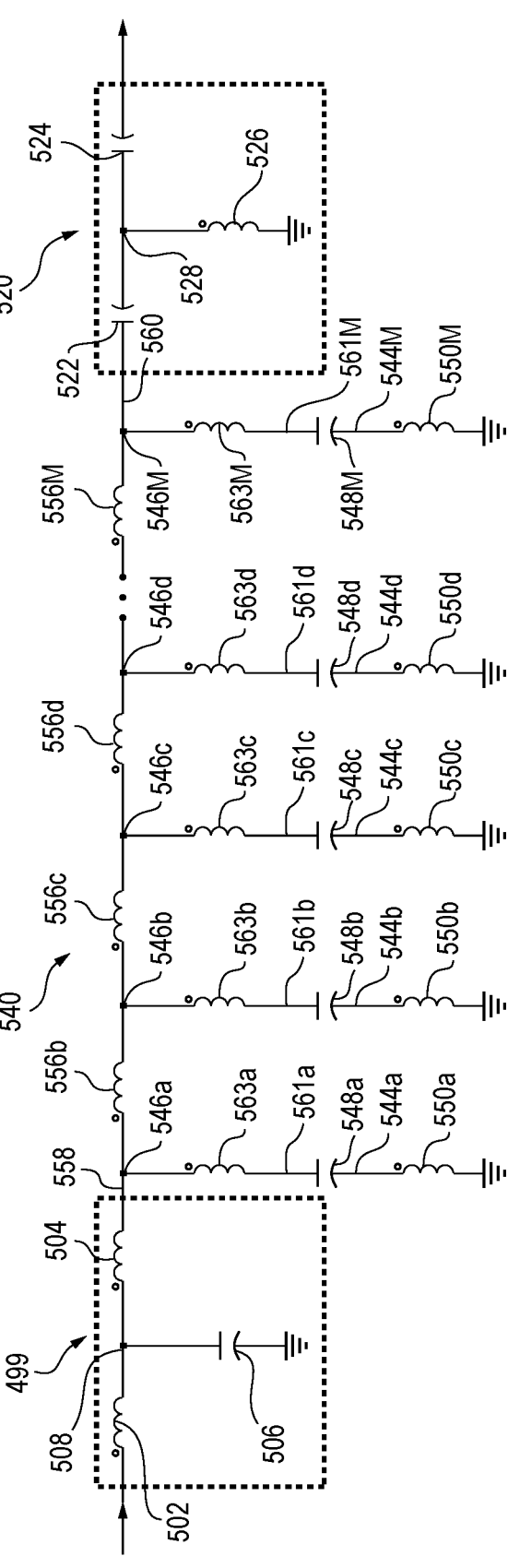

Other characteristic(s) can be obtained by varying one or more impedances of the NLTL. FIGS. 24-26B illustrate an embodiment in which elements in FIGS. 24-26B that correspond to those shown in FIGS. 18-20D (except, possibly, as to diode sizes and impedance values and/or as otherwise described herein) are identified by the same reference number of FIGS. 18-20D increased by 200. According to the embodiment of FIGS. 24-26B, the dimensions (e.g., lengths and/or widths) and impedances of the transmission line portions may vary from transmission line cell to transmission line cell. Specifically, as seen in FIG. 24, the transmission line portions 52b, 52c, . . . , 52M of FIG. 9, are replaced by transmission line portions 552b, 552c, . . . , 552M, respectively. The portions 552b, 552c, . . . , 552M may all have the same lengths and widths or may be of different lengths and/or widths, and hence the impedances of such portions may all be the same or some or all may be different from one another.

Figure 25:
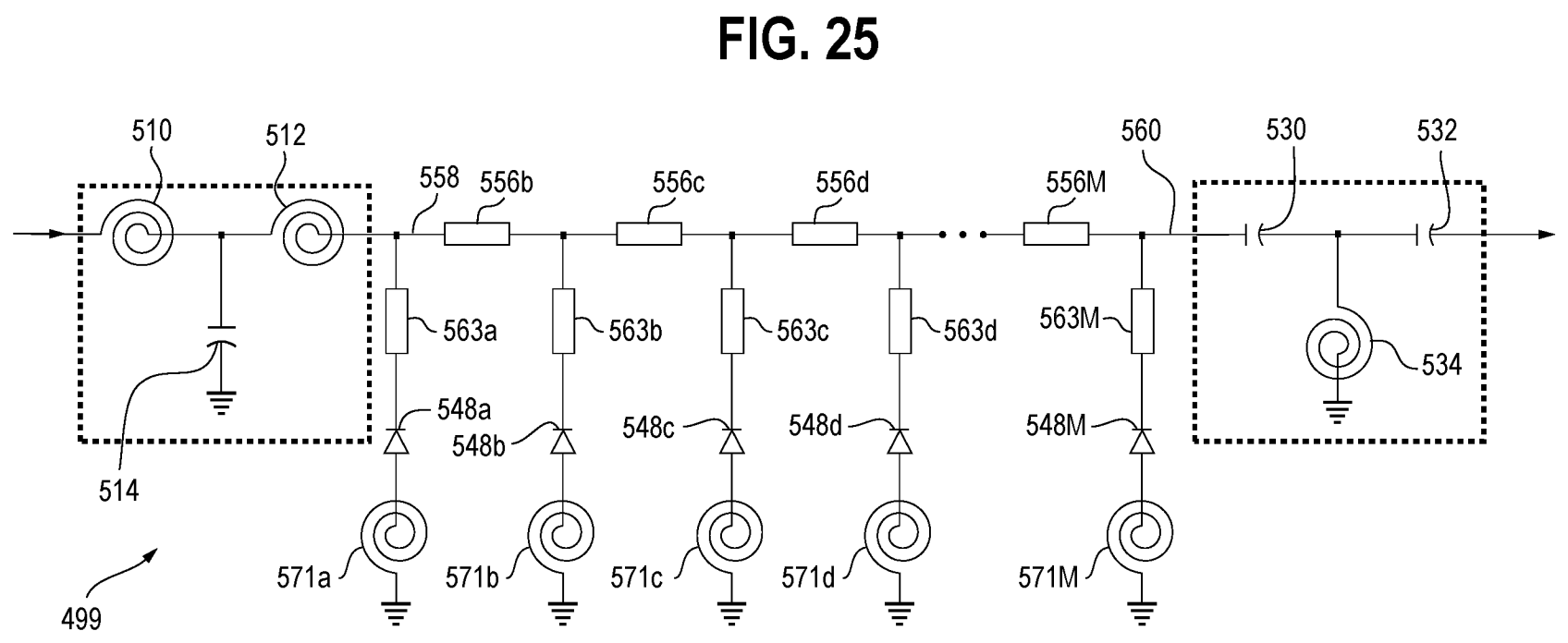
Figure 26A:
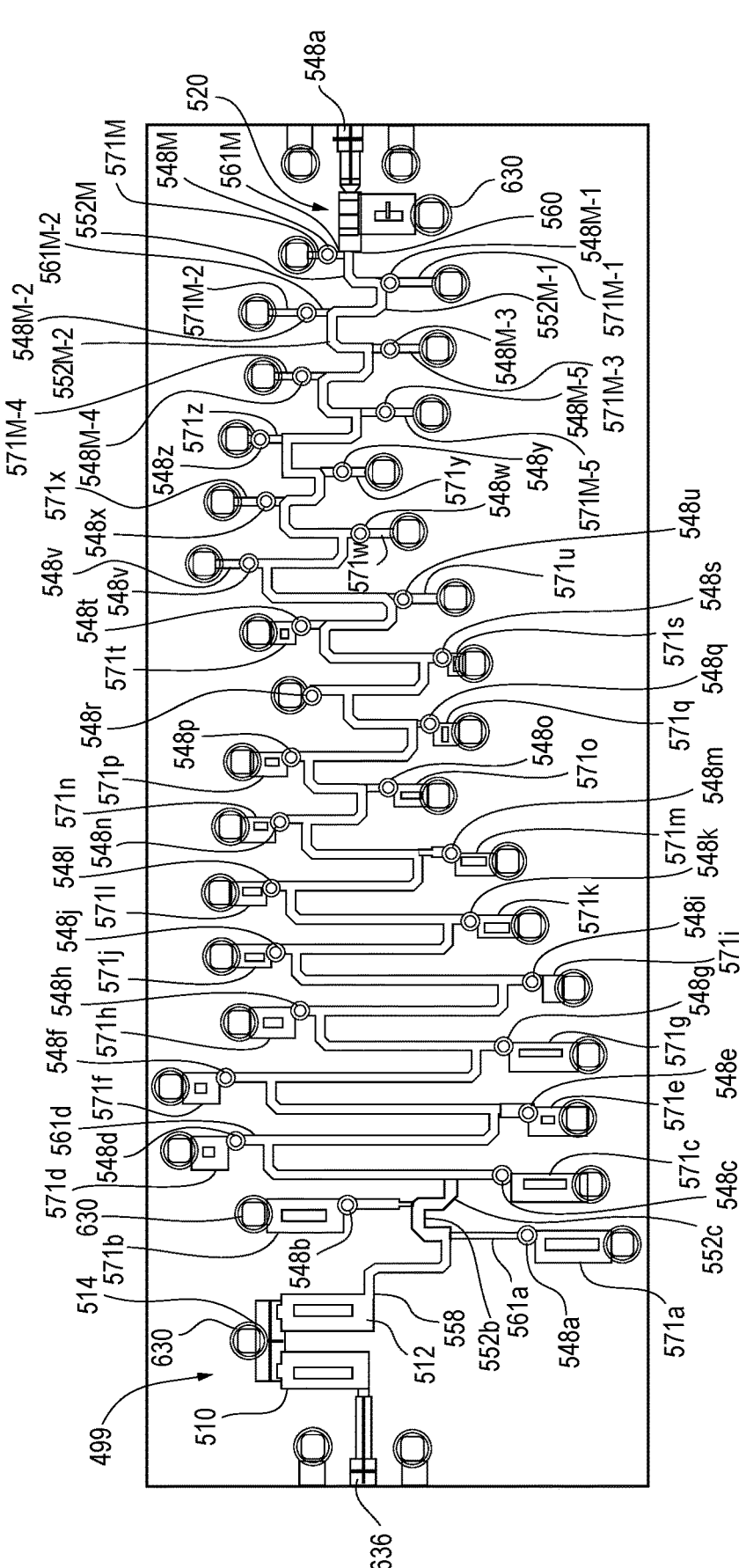
Figure 26B:
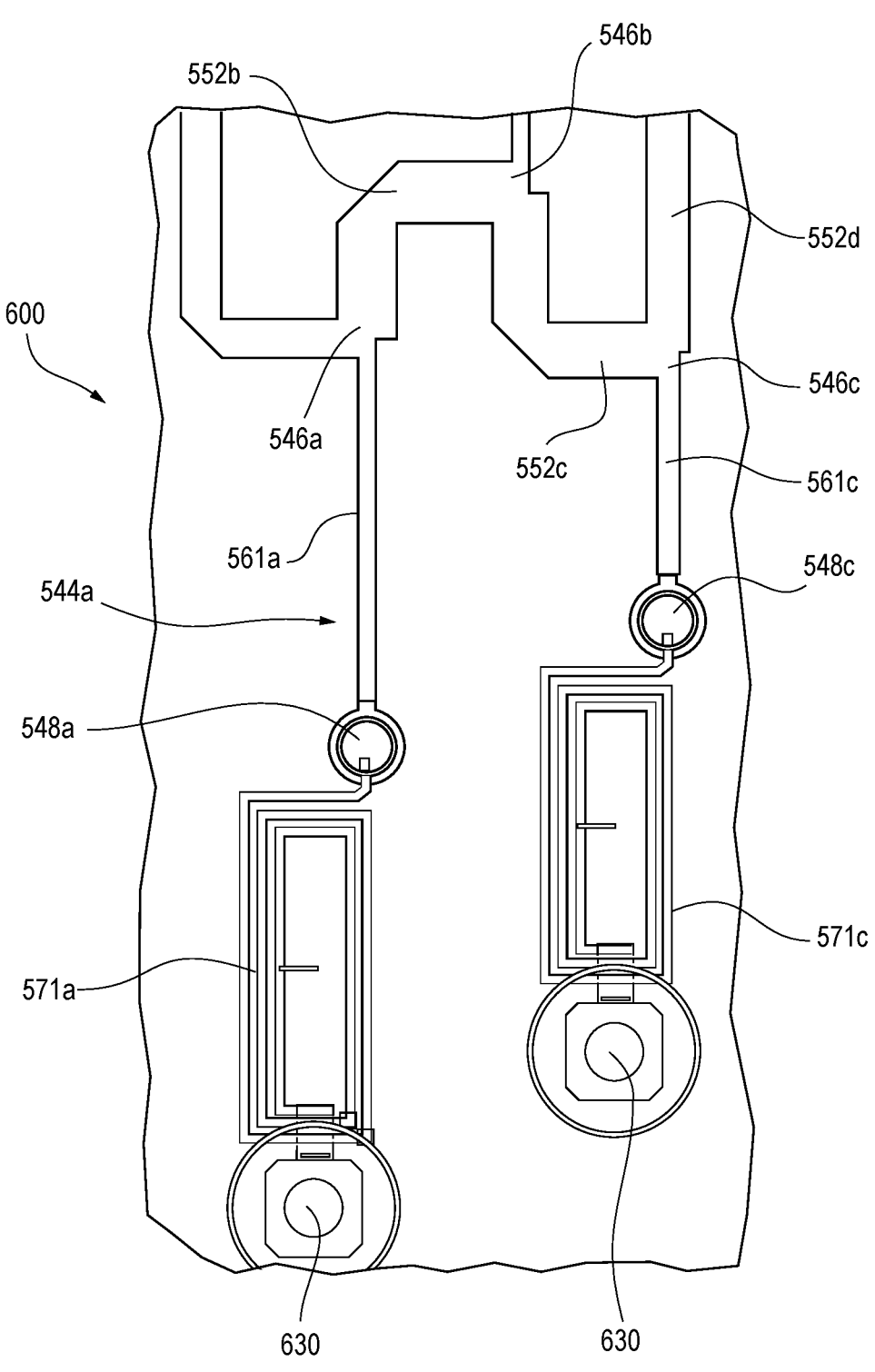
FIGS. 26B and 26C are enlarged, fragmentary, plan views of portions of the chip of FIG. 26A.

Referring also to FIGS. 25-26B, still further, additional shunt transmission line portions 561a, 561b, . . . , 561M having impedances 563a, 563b, . . . , 563M, respectively, may be coupled in series in the shunt paths 544*a*, 544*b*, . . . , 544M, respectively between the varactor diodes 548*a*, 548*b*, . . . , 548M and the junctions 546*a*, 546*b*, . . . , 546M, respectively (only some of the shunt paths 544 and junctions 546 are labeled in FIG. 26B7 only). The shunt transmission line portions 561*a*, 561*b*, . . . , 561M may all be of different lengths and/or widths, and hence the impedances 563*a*, 563*b*, . . . , 563M may all be different. Alternatively, one or more of the transmission line portions 561 may be of equal length(s) and width(s) as one or more other transmission line portions 561, in which case respective two or more of the portions 561 may have equal impedances 563, while any remaining portions 561 may have different impedances than the respective two or more of the portions 561 due to difference(s) in length(s) and/or width(s) thereof. Any remaining portions 561 may have different impedances from each other or some or all may have the same or different impedance(s).

FIG. 25 illustrates a realization of FIG. 24 wherein the inductors 550*a*, 550*b*, . . . , 550M are implemented by spiral inductors 571*a*, 571*b*, . . . , 571M, respectively, similar or identical to the realizations described previously. As noted above, each shunt path includes a shunt transmission line portion 561, a varactor diode 548 coupled in series with the transmission line portion, and an inductor 571 coupled in series with the varactor diode 548.

FIG. 26A illustrates a chip 600 that may implement the NLTL 540 of FIGS. 24 and 25. By way of example, and not for purposes of limitation, estimated values of the components shown in FIG. 26 in which M=32 may be as follows:

TABLE 5

| Diode | Diameter | Cap. Value | Inductor | Turns | Length | Ind. Value |
|-------|----------|-----------|----------|-------|--------|-----------|
| 548a | 45.0 | 1.281 | 571a | 2.5 | 212.0 | 1.667 |
| 548b | 44.5 | 1.252 | 571b | 2.5 | 208.0 | 1.647 |
| 548c | 45.0 | 1.281 | 571c | 2.5 | 186.0 | 1.528 |
| 548d | 32.0 | 0.635 | 571d | 2.5 | 67.0 | 0.831 |
| 548e | 21.5 | 0.282 | 571e | 2.5 | 65.0 | 0.819 |
| 548f | 13.0 | 0.106 | 571f | 2.5 | 64.0 | 0.813 |
| 548g | 10.0 | 0.068 | 571g | 2.5 | 198.0 | 1.593 |
| 548h | 33.0 | 0.676 | 571h | 2.5 | 85.0 | 0.939 |
| 548i | 42.5 | 1.139 | 571i | 1.5 | 139.0 | 0.557 |
| 548j | 36.5 | 0.832 | 571j | 1.5 | 93.0 | 0.432 |
| 548k | 32.0 | 0.635 | 571k | 1.5 | 95.0 | 0.437 |
| 548l | 28.5 | 0.501 | 571l | 1.5 | 88.0 | 0.519 |
| 548m | 23.5 | 0.337 | 571m | 1.5 | 6.0 | 0.468 |
| 548n | 22.0 | 0.295 | 571n | 1.5 | 83.0 | 0.405 |
| 548o | 22.0 | 0.295 | 571o | 1.5 | 82.0 | 0.402 |
| 548p | 21.5 | 0.282 | 571p | 1.5 | 82.0 | 0.402 |
| 548q | 18.5 | 0.208 | 571q | 1.5 | 37.0 | 0.276 |
| 548r | 23.0 | 0.323 | 571r | 1.5 | 16.0 | 0.213 |
| 548s | 18.5 | 0.208 | 571s | 1.5 | 3.0 | 0.163 |
| 548t | 20.0 | 0.244 | 571t | 1.5 | 45.0 | 0.300 |
| 548u | 23.0 | 0.323 | 571u | 0.5 | 119.0 | 0.103 |
| 548v | 23.0 | 0.323 | 571v | 0.5 | 116.5 | 0.101 |
| 548w | 22.0 | 0.295 | 571w | 0.5 | 125.0 | 0.108 |
| 548x | 26.5 | 0.431 | 571x | 0.5 | 95.0 | 0.082 |
| 548y | 7.0 | 0.041 | 571y | 0.5 | 120.0 | 0.104 |
| 548z | 34.0 | 0.719 | 571z | 0.5 | 29.0 | 0.025 |
| 548M-5 | 25.5 | 0.399 | 571M-5 | 0.5 | 127.0 | 0.110 |
| 548M-4 | 13.0 | 0.106 | 571M-4 | 0.5 | 90.5 | 0.078 |
| 548M-3 | 20.5 | 0.256 | 571M-3 | 0.5 | 123.0 | 0.106 |
| 548M-2 | 10.0 | 0.068 | 571M-2 | 0.5 | 133.0 | 0.115 |
| 548M-1 | 6.0 | 0.035 | 571M-1 | 0.5 | 79.5 | 0.069 |
| 548M | 25.0 | 0.383 | 571M | 0.5 | 64.5 | 0.056 |

As an example, the chip 600 of FIG. 26A has an input low-pass filter 499 comprising capacitor 514=5.0 pF, inductor 510=3.2 nH, inductor 512=3.3 nH, and having a cut-off frequency of 1.3 GHz., and further has output high-pass filter 520 comprising capacitors 530, 532=0.3 pF, and =1.7 pF, respectively, and inductor 534=2.0 nH, with a cut-off frequency of 4.3 GHz.

In addition, the main transmission line and shunt transmission line ("main T.L." and "shunt T.L.," respectively, in Table 6 below) trace widths and lengths for the chip 600 may be as follows:

TABLE 6

| Main T.L. | Width of main T.L. | Length of main T.L. | Shunt T.L. | Width of shunt T.L. | Length of shunt T.L. |
|-----------|--------------------|--------------------|------------|---------------------|---------------------|
| 556a | 28 | 497 | 561a | 12.7 | 249.9 |
| 556b | 47 | 162.6 | 561b | 12.4 | 207.6 |
| 556c | 43.3 | 169.6 | 561c | 16 | 153.9 |
| 556d | 33.7 | 706.8 | 561d | 25.8 | 89.7 |
| 556e | 31.2 | 864.2 | 561e | 28.7 | 82.9 |
| 556f | 24.1 | 850.9 | 561f | 13.4 | 146.1 |
| 556g | 30 | 790.2 | 561g | 14.9 | 80.1 |
| 556h | 32 | 620.7 | 561h | 29.2 | 41.1 |
| 556i | 20.5 | 707.7 | 561i | 22.4 | 79 |
| 556j | 20.9 | 789.6 | 561j | 23.4 | 32.8 |
| 556k | 22.4 | 601.5 | 561k | 13.8 | 57.1 |
| 556l | 29 | 614.5 | 561l | 20.4 | 39.2 |
| 556m | 28.7 | 511.7 | 561m | 21 | 84 |
| 556n | 33 | 465.8 | 561n | 21.6 | 64.5 |
| 556o | 30.6 | 269.8 | 561o | 17.8 | 62.8 |
| 556p | 40.5 | 259.6 | 561p | 23.1 | 31.4 |
| 556q | 30.5 | 425.1 | 561q | 22.4 | 47.8 |
| 556r | 33.5 | 295.4 | 561r | 32.7 | 63.5 |
| 556s | 40.2 | 321.8 | 561s | 38.6 | 43.6 |
| 556t | 24.8 | 420.6 | 561t | 24.7 | 55.4 |
| 556u | 34.7 | 311.2 | 561u | 21.5 | 36.5 |
| 556v | 35.3 | 511.2 | 561v | 19.7 | 38 |
| 556w | 34.3 | 322.3 | 561w | 25.6 | 48.6 |
| 556x | 32.5 | 264.4 | 561x | 28 | 46.1 |
| 556y | 30.4 | 190.3 | 561y | 12.8 | 63.7 |
| 556z | 22.9 | 179.9 | 561z | 31.3 | 61 |
| 556M-5 | 25.1 | 301.5 | 561M-5 | 19.2 | 69.4 |
| 556M-4 | 32.6 | 201.2 | 561M-4 | 16.9 | 54.1 |
| 556M-3 | 35.7 | 211.9 | 561M-3 | 21.5 | 59.7 |
| 556M-2 | 38.7 | 208.5 | 561M-2 | 14 | 71.4 |
| 556M-1 | 34.7 | 231.6 | 561M-1 | 10.6 | 111 |
| 556M | 39.4 | 164.6 | 561M | 20.7 | 42.9 |

Figure 26C:
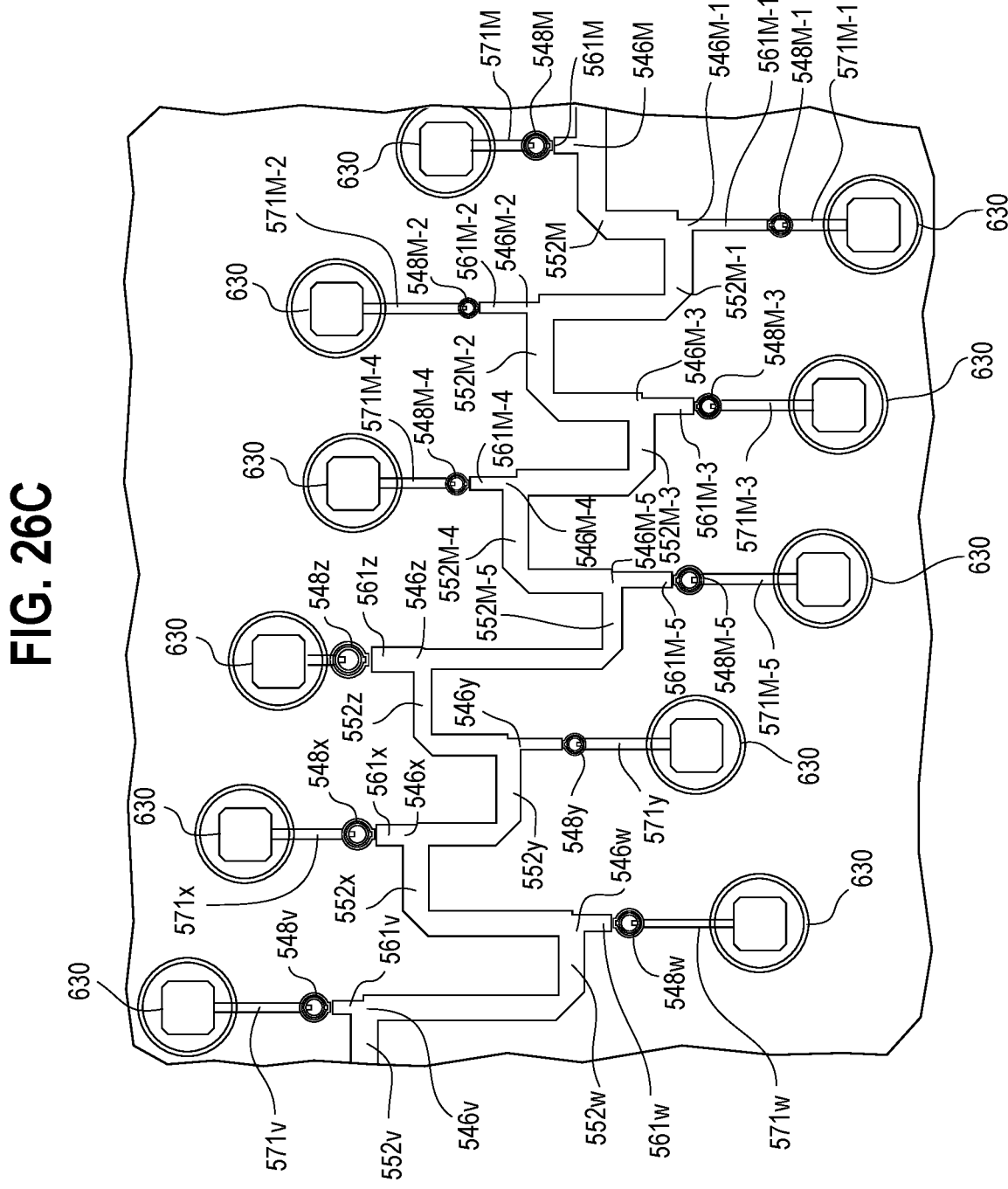

FIGS. 26B and 26C illustrate in enlarged detail portions of the chip 600 illustrating variation of widths and lengths of main transmission lines and shunt transmission lines as well as use of straight line inductors as described above.

Figure 27:
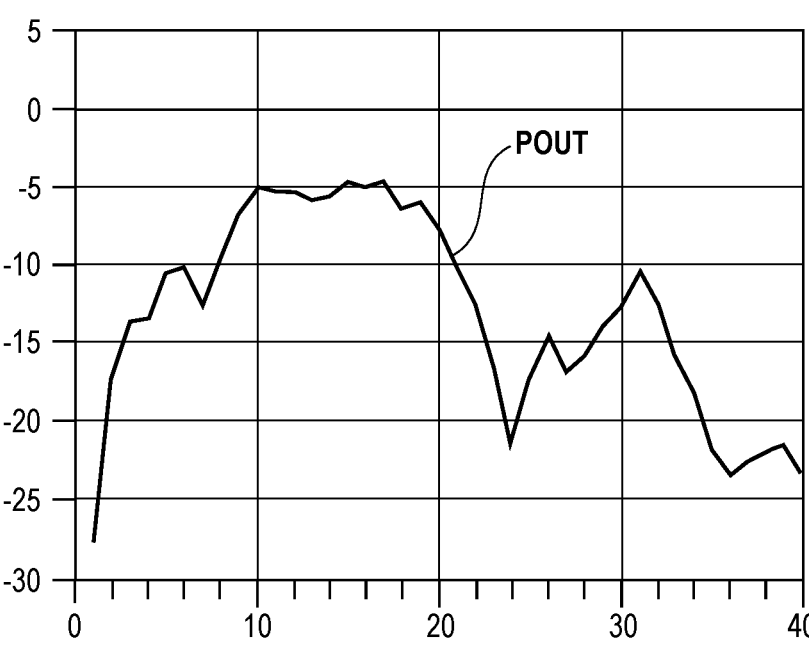

FIG. 27 illustrates output power as a function of frequency for the NLTL 540 implemented by the chip 600. The chip 600 of FIG. 26A was designed for the $10^{th}$ to $19^{th}$ harmonics. FIG. 27 illustrates that the fundamental and lower harmonics are suppressed and that the chip 600 develops increased magnitudes in a band-pass manner between approximately the $10^{th}$ and $19^{th}$ harmonics.

The features described above in connection with FIGS. 24-26A regarding the variation of transmission line portion lengths and widths and the inclusion of variable lengths and or widths of transmission line portions in the shunt paths increase the degrees of freedom in tailoring the NLTL spectrum, even though their impacts are less than diode sizes, use of shunt inductors, and the inclusion of input and/or output filters.

Figure 28:
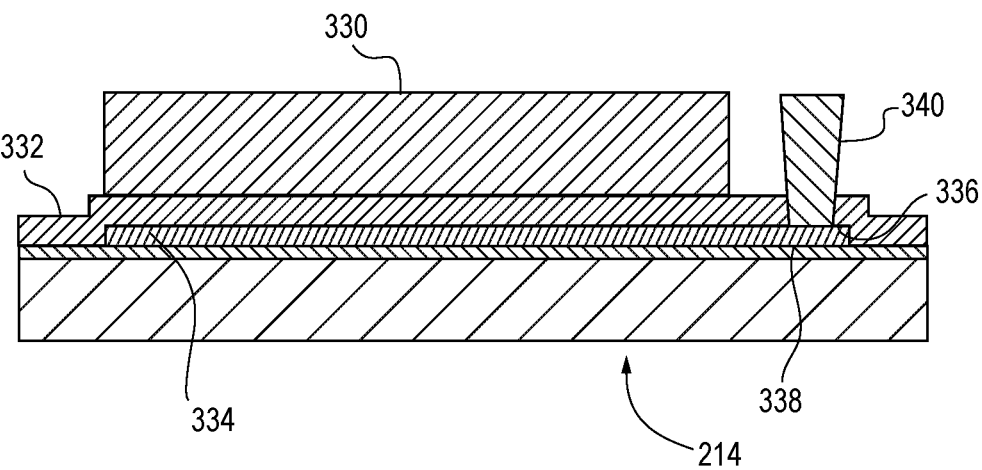
FIG. 28 is an enlarged, fragmentary, sectional view of the capacitors of FIGS. 17, 19, and 25.

Referring next to FIG. 28, the MIM capacitors 214, 330, 332, 514, 530, and 532 are formed on the dielectric layer 106 and the layer 106 is, in turn, disposed atop the semi-insulating substrate 102. The capacitors 214, 330, 332, 514, and 532 are identical to one another (except, perhaps, as to capacitance value), and hence, only the capacitor 214 will be described in detail herein. The capacitor 214 comprises a first metal electrode 330 disposed on a capacitor dielectric body 332 formed atop the dielectric layer 106. A metal interconnect member 334 is disposed atop the dielectric layer 106 in a recess 336 in an underside 338 of the capacitor dielectric body 332. A second metal electrode 340 extends through the capacitor dielectric body 332 into contact with the interconnect member 334. The elements 330, 334, and 340 are made of a suitable electrically conductive metal.

As in the other embodiments disclosed herein, except as described otherwise herein, the various elements are interconnected by conductive traces that are formed on or in the various chips disclosed herein.

INDUSTRIAL APPLICABILITY

In summary, the NLTLs as disclosed herein develop controllable magnitudes of harmonic components as compared to known NLTLs. Embodiments disclosed herein simultaneously eliminate the otherwise strong fundamental leak-through, re-shape the strong $-20*\log_{10}(N)$ lower-index harmonics, and generate arbitrary selected frequencies in, for example, band-pass fashion.

Note that diode sizes and inductor sizes are different between any two examples above. For example, FIG. 17A is not simply identical to FIG. 9 with the addition of an input filter. Instead, the diodes and inductors in FIG. 17A are optimized with the input filter simultaneously and have different sizes from those in FIG. 9.

In another example, FIG. 20A and FIG. 22 have the same circuit topology but different component values because the embodiments are optimized for different sets of harmonic frequencies.

Even with the same circuit topology, same number of diodes, same input frequency, and same target harmonic frequencies, two circuits will have different optimized component values if the diode bias voltage or the input RF power are different.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar references in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

Numerous modifications to the present disclosure will be apparent to those skilled in the art in view of the foregoing description. It should be understood that the illustrated embodiments are exemplary only, and should not be taken as limiting the scope of the disclosure.

We claim:

1. A nonlinear transmission line (NLTL), comprising:
   a plurality of transmission line cells interconnected between an input and an output, each transmission line cell including a shunt path coupled to a main transmission line portion wherein the shunt path includes a shunt transmission line portion, a varactor diode coupled in series with the shunt transmission line portion, and an inductor coupled in series with the varactor diode wherein the NLTL is operable to conduct at least one frequency component through the NLTL; and
   at least one of a low-pass filter directly coupled to the input and a high-pass filter directly coupled to the output wherein the at least one of the low-pass filter and the high-pass filter is operable to reflect the at least one frequency component away from at least one of the input and the output and into the NLTL.

2. The NLTL of claim 1, wherein both the low pass filter is coupled to the input and the high-pass filter is coupled to the output.

3. The NLTL of claim 2, wherein at least some of the shunt transmission line portions have different impedances.

4. The NLTL of claim 1, wherein at least some of the main transmission line portions have different impedances.

5. The NLTL of claim 1, wherein at least some of the varactor diodes are of a different size than remaining varactor diodes.

6. The NLTL of claim 1, wherein at least some of the inductors have different inductive values than remaining inductors.

7. The NLTL of claim 1, wherein each main transmission line portion is formed by a conductive trace.

8. The NLTL of claim 7, wherein the conductive traces all have equal widths.

9. The NLTL of claim 1, wherein the interconnected transmission line cells are carried by a substrate to form a chip.

10. A nonlinear transmission line (NLTL), comprising:
    a plurality of transmission line cells interconnected between an input and an output, each transmission line cell including a shunt path coupled to a main transmission line portion wherein the shunt path includes a shunt transmission line portion, a varactor diode coupled in series with the shunt transmission line portion, and an inductor coupled in series with the varactor diode; and
    at least one of a low-pass filter directly coupled to the input and a high-pass filter directly coupled to the output;
    wherein the interconnected transmission line cells are carried by a substrate to form a chip; and
    wherein a dielectric layer is disposed on a surface of the substrate and each shunt path includes an inductor having a first portion disposed on the dielectric layer and a second portion spaced from the dielectric layer and the substrate to form an air-bridged portion.

11. The NLTL of claim 10, wherein each inductor comprises a spiral inductor formed on a first side of the chip and wherein an end of each inductor is coupled by a via to a ground plane formed on a second side of the chip.

12. The NLTL of claim 1, wherein at least some of the varactor diodes are DC biased and are of a different size than remaining varactor diodes and wherein the varactor diodes are coupled in a first polarity when the DC bias has a first level and are coupled in a second polarity when the DC bias has a second level.

13. A nonlinear transmission line (NLTL), comprising:

a plurality of transmission line cells interconnected between an input and an output, wherein each transmission line cell includes a shunt path coupled to a main transmission line portion, wherein the shunt path includes a shunt transmission line, a varactor diode coupled in series with the shunt transmission line, and an inductor coupled in series with the varactor diode, and wherein at least some of the shunt transmission lines have different impedances than remaining shunt transmission line portions wherein the NLTL is operable to conduct at least one frequency component through the NLTL;

a low-pass filter directly coupled to the input; and a high-pass filter coupled to the output;

wherein each of the low-pass filter and the high-pass filter is operable to reflect the at least one frequency component away from the input and the output, respectively, and into the NLTL.

14. The NLTL of claim 13, wherein at least some of the main transmission line portions have different impedances.

15. The NLTL of claim 14, wherein at least some of the varactor diodes are of a different size than remaining varactor diodes.

16. The NLTL of claim 14, wherein at least some of the inductors have different inductive values than remaining inductors.

17. A nonlinear transmission line (NLTL), comprising:

a plurality of transmission line cells interconnected between an input and an output, wherein each transmission line cell includes a shunt path coupled to a main transmission line portion, wherein the shunt path includes a shunt transmission line, a varactor diode coupled in series with the shunt transmission line, and an inductor coupled in series with the varactor diode, and wherein at least some of the shunt transmission lines have different impedances than remaining shunt transmission line portions;

a low-pass filter directly coupled to the input; and a high-pass filter coupled to the output;

wherein the interconnected transmission line cells are carried by a substrate to form a chip, wherein a dielectric layer is disposed on a surface of the substrate, wherein each inductor includes a first portion disposed on the dielectric layer and a second portion spaced above the dielectric layer and the substrate, and wherein an end of each inductor is coupled by a via to a ground plane of the chip.

18. A nonlinear transmission line (NLTL), comprising:

a plurality of transmission line cells interconnected between an input and an output, wherein each transmission line cell includes a shunt path coupled to a main transmission line portion having an impedance wherein the shunt path includes a shunt transmission line portion having an impedance, a varactor diode coupled in series with the shunt transmission line portion, and an inductor coupled in series with the varactor diode, wherein at least some of the varactor diodes are of a different size than remaining varactor diodes, wherein at least some of the impedances of the main transmission line portions are different than the impedances of remaining main transmission line portions, wherein the impedance of at least one of the shunt transmission line portions is different than the impedances of other shunt transmission line portions, and at least one of the inductors has an impedance different than impedances of other inductors;

wherein at least one of a low-pass filter is coupled to the input and a high-pass filter is coupled to the output; and wherein the interconnected transmission line cells are carried by a substrate to form a chip, wherein a dielectric layer is disposed on a surface of the substrate, and wherein each inductor includes a first portion disposed on the dielectric layer and a second portion spaced from the dielectric layer and the substrate.

19. The NLTL of claim 18, wherein an end of each inductor is coupled by a via to a ground plane of the chip.

20. A nonlinear transmission line (NLTL), comprising:

a plurality of transmission line cells interconnected between an input and an output, each transmission line cell including a shunt path coupled to a main transmission line portion wherein the main transmission line portions have at least one of varying lengths and varying widths;

wherein the interconnected transmission line cells are carried by a substrate to form a chip; and wherein a dielectric layer is disposed on a surface of the substrate and each shunt path includes an inductor having a first portion disposed on the dielectric layer and a second portion spaced from the dielectric layer and the substrate to form an air-bridged portion.

21. The NLTL of claim 20, wherein at least some of the main transmission line portions have different impedances.

22. The NLTL of claim 21, wherein each shunt path of each transmission line cell includes a shunt transmission line portion and at least first and second of the shunt transmission line portions of first and second shunt paths, respectively, have different impedances.

23. The NLTL of claim 21, wherein at each shunt path of each transmission line cell includes a shunt transmission line portion coupled to an associated varactor diode and wherein at least first and second of the varactor diodes of first and second shunt paths, respectively, are of a different size than remaining varactor diodes.

24. The NLTL of claim 20, wherein the shunt path of each transmission line cell includes a varactor diode coupled in series with the inductor and a shunt transmission line portion coupled in series with the inductor, and wherein at least one of the shunt transmission lines of one of the transmission line cells has a different impedance than impedances of remaining shunt transmission line portions of remaining transmission line cells.

25. A nonlinear transmission line (NLTL), comprising:

a plurality of transmission line cells interconnected between an input and an output, each transmission line cell including a shunt path coupled to a main transmission line portion wherein the shunt path includes a shunt transmission line portion, a varactor diode coupled in series with the shunt transmission line portion, and an inductor coupled in series with the varactor diode; and at least one of a low-pass filter coupled to the input and a high-pass filter coupled to the output;

wherein the interconnected transmission line cells are carried by a substrate to form a chip; and wherein a dielectric layer is disposed on a surface of the substrate and each shunt path includes an inductor having a first portion disposed on the dielectric layer and a second portion spaced from the dielectric layer and the substrate to form an air-bridged portion.

26. The NLTL of claim 25, wherein each inductor comprises a spiral inductor formed on a first side of the chip and wherein an end of each inductor is coupled by a via to a ground plane formed on a second side of the chip.

\* \* \* \* \*